United States Patent [19]
Hirano et al.

[11] Patent Number: 5,467,302
[45] Date of Patent: Nov. 14, 1995

[54] SEMICONDUCTOR MEMORY DEVICE

[75] Inventors: Hiroshige Hirano, Nara; Tatsumi Sumi, Osaka; Nobuyuki Moriwaki; George Nakane, both of Kyoto, all of Japan

[73] Assignee: Matsushita Electric Industrial Company, Ltd., Osaka, Japan

[21] Appl. No.: 354,476

[22] Filed: Dec. 12, 1994

Related U.S. Application Data

[63] Continuation of Ser. No. 161,328, Dec. 2, 1993, Pat. No. 5,392,234.

[30] Foreign Application Priority Data

Dec. 2, 1992 [JP] Japan .................................. 4-322983

[51] Int. Cl.⁶ .................................................. G11C 11/22
[52] U.S. Cl. ...................................... 361/145; 365/189.01
[58] Field of Search .............................. 365/145, 189.01

[56] References Cited

U.S. PATENT DOCUMENTS 5,381,364  1/1995  Chern et al. ......................... 365/145

FOREIGN PATENT DOCUMENTS 4110407  10/1991  Germany.
4118847  12/1991  Germany.

Primary Examiner—Terrell W. Fears
Attorney, Agent, or Firm—Ratner & Prestia

[57] ABSTRACT

Bit lines BL0 and /BL0 are connected to a sense amplifier SA0, the gate of a first MOS transistor to a first word line WL0, a first electrode of a first ferrodielectric capacitor Cs1 to the source of the first Qn, the drain of the first Qn to BL0, a second electrode of Cs1 to a first plate electrode CP0, the gate of a second MOS transistor Qn to a second word line DWL0, a first electrode of a second ferrodielectric capacitor Cd2 to the source of the second Qn, the drain of the second Qn to /BL0, and a second electrode of Cd1 to a second plate electrode DCP0, and after turning off the second Qn, the logic voltage of DCP0 is inverted. Hence, in a semiconductor memory device employing the ferrodielectric element, the dummy memory capacitor is initialized securely, and high speed reading is enabled without concentration of power consumption.

31 Claims, 20 Drawing Sheets

SEMICONDUCTOR MEMORY DEVICE

This application is a continuation of application Ser. No. 08/161,328, filed Dec. 2, 1993 now U.S. Pat. No. 5,392,234.

BACKGROUND OF THE INVENTION

1. Field of the Invention

The present invention relates to a semiconductor memory device.

2. Description of the Related Prior Art

A semiconductor memory device chiefly operates on a method of accumulating electric charges in a capacitor formed in the semiconductor device, and storing the data depending on the presence or absence of electric charge (generally called dynamic random access memory or DRAM). In this capacitor, a silicon oxide film is generally used as an insulation film.

Recently is devised, by using a ferrodielectric material as this insulation film, a semiconductor memory device for making nonvolatile the data to be stored.

A conventional semiconductor memory using ferrodielectric material is described below while referring to U.S. Pat. No. 4,873,664.

FIG. 24 is a circuit diagram of a conventional semiconductor memory device. FIG. 25 is an operation timing chart of the semiconductor memory device of FIG. 24, FIG. 26 is a diagram showing the hysteresis characteristic of ferrodielectric element used in the main body cell capacitor in the conventional semiconductor memory device of FIG. 26, and FIG. 27 is a diagram showing the hysteresis characteristic of the ferrodielectric element used in a dummy cell capacitor in the conventional semiconductor memory device.

In the circuit configuration of the conventional semiconductor memory device in FIG. 24, bit lines 26, 28 are connected to a sense amplifier 30. Main body memory cells 20a, 20b, 20c and 20d, 20e, and dummy memory cells 46 and 36 are connected to the bit lines 26 and 28, respectively. The main body memory cell 20a is composed of a MOS transistor 24 and a main body memory cell capacitor 22. The gate of the MOS transistor 24 is connected to a word line 32, the drain of the MOS transistor 24 is connected to the bit line 26, and the source of the MOS transistor 24 is connected to a first electrode of the main body memory cell capacitor 22. A second electrode of the main body memory cell capacitor 22 is connected to a cell plate electrode 34. Similarly, the dummy memory cell 36 is composed of a MOS transistor 38 and a dummy memory cell capacitor 40. The gate of the MOS transistor 38 is connected to a dummy word line 42, the drain of the MOS transistor 38 is connected to the bit line 28, and the source of the MOS transistor 38 is connected to a first electrode of the dummy memory cell capacitor 40. A second electrode of the dummy memory cell capacitor 40 is connected to a dummy cell plate electrode 44.

The operation of this conventional semiconductor memory cell device is explained below by reference to the operation timing chart in FIG. 25, the hysteresis characteristic diagram of the ferrodielectric element of the main body memory cell capacitor in FIG. 26, and the hysteresis characteristic diagram of the ferrodielectric element of the dummy memory cell capacitor in FIG. 27.

FIG. 26 and FIG. 27 are the hysteresis characteristic diagrams of the ferrodielectric element. The axis of abscissas denotes the electric force applied to the memory cell capacitor, and the axis of ordinates represents the electric charge at that time. As shown in FIG. 26 and FIG. 27, in the ferrodielectric capacitor, if the electric force is 0, the residual polarization is left over as indicated at point B, point E, point K, and point H. After turning off the power source, too, a residual polarization occurs in the ferrodielectric capacitor. By making use thereof to obtain nonvolatile data, a nonvolatile semiconductor memory device is realized. The main body memory cell capacity is in the state of point B in FIG. 26 when the memory cell data is 1, and in the state of point E in FIG. 26 when the memory cell data is 0. The initial state of the dummy memory cell capacitor is the state of point K in FIG. 27. Herein, to read out the data in the main body memory cell, as initial state, the logic voltages of the bit lines 26 and 28, word line 32, dummy word line 42, cell plate electrode 34, and dummy cell plate electrode 44 are set to L. Later, the bit lines 26 and 28 are set in floating state.

Next, as shown in FIG. 25, the word line 32, dummy word line 42, cell plate electrode 34, and dummy cell plate 44 are all set to logic voltage H. As a result, the MOS transistors 24 and 38 are turned on, and electric force is applied to the main body memory cell capacitor 22 and dummy memory cell capacitor 40. At this time, if the data of the main body memory cell is 1, the state at point B in FIG. 26 is changed to the state at point D, and an electric charge Q1 is read out in the bit line 26. If the data of the main body memory cell is 0, the state at point E in FIG. 26 is changed to the state at point D, and an electric charge Q0 is read out in the bit line 26. The dummy memory cell changes from the state at point K in FIG. 27 to the state at point J, and an electric charge Qd is read out in the bit line 28. The data of the main body memory cell read out in the bit line 26 and the data of the dummy memory cell read out in the bit line 28 are amplified by the sense amplifier 30, and the data in the main body memory cell are read out.

When the data of the main body memory cell is 1, the bit line 26 is at logic voltage H, and the cell plate electrode 34 is at logic voltage H. Accordingly, electric force is not applied to the main body memory cell capacitor 22, thereby coming in the state at point E in FIG. 26. Afterwards, to return the state of the data of the main body memory cell capacitor 22 to the state at point B in FIG. 26, the logic voltage of the cell plate electrode 34 is set to L, and is once to set the state at point A in FIG. 26, and the logic voltage of the word line 32 is set to L. When the word line 32 is at logic voltage L, electric force is not applied to the main body memory cell capacitor 22, thereby returning to the state at point B in FIG. 26.

Likewise, when the data of the main body memory cell is 0, the bit line 26 comes to the logic voltage L, and the cell plate electrode 34 comes to the logic voltage H. Accordingly, the main body memory cell capacitor 22 is in the state of point D in FIG. 26. When the cell plate electrode 34 is at logic voltage L, electric force is not applied to the main body memory cell capacitor 22, thereby coming to the state of point E in FIG. 26. Afterwards, the logic voltage of the word line 32 comes at L, and electric force is not applied yet to the main body memory cell capacitor 22, thereby remaining at the state of point E in FIG. 26.

In the dummy memory cell, when the main body memory cell data is 1, the bit line 28 is at the logic voltage L, and the cell plate electrode 44 is at the logic voltage H. Accordingly, the dummy memory cell capacitor 40 is in the state of point J in FIG. 27. Later, when the dummy word line 36 is at the logic voltage L, electric force is not applied to the dummy memory cell capacitor 40, thereby returning to the state of point K in FIG. 27.

Similarly, when the data of the main body memory cell is 0, the bit line 28 is at the logic voltage H, and the cell plate electrode 44 is at the logic voltage H. Accordingly, the dummy memory cell capacitor 40 is in the state at point K in FIG. 27. When the dummy word line 36 is later set to the logic voltage L, if the logic voltage of the dummy cell plate electrode 44 is set to L at the same time, the state of no application of electric force in the dummy cell memory capacitor 40 is unchanged, and the state at point K in FIG. 27 is maintained.

However, in the semiconductor memory device of the conventional constitution and operation as shown above, as the initial state right after manufacturing process, the dummy memory cell capacitor does not always become state of point K in FIG. 27. Hence, if the initial state is the state of point H in FIG. 27, the problem was that malfunction occurred in the first reading.

In the conventional semiconductor memory device, after reading out the data, and amplifying the electric charge being read out in the bit line by the sense amplifier, the dummy word line 42 and dummy cell plate electrode 44 are simultaneously set to the logic voltage L. Therefore, for example, if the parasitic capacity of the dummy word line 42 is large and the fall of the dummy word line 42 is later than the fall of the dummy cell plate electrode, at the time of "0" of the data of the main body memory cell, the bit line 28 comes to the logic voltage H, and the cell plate electrode 44 comes to the logic voltage L. Hence, the dummy memory cell capacitor 40 comes to the state of point G in FIG. 27. As the dummy word line 42 is later set to the logic voltage L, the dummy memory cell capacitor 40 comes to the state of point H in FIG. 27. Thus, unless the dummy memory cell capacitor 40 is in the state at point K in FIG. 27 which is the initial state, the problem was that malfunction occurred at the next time of reading out the memory cell.

Another problem was that the data was read out in the bit line very late because the cell plate electrode was raised after raising the word line when reading out the data of the memory cell.

Besides, the rise of word line and dummy word line, and that of cell plate electrode and dummy cell plate, were simultaneous, and the fall of word line and dummy word line and that of dummy cell plate were simultaneous, and hence much electric power was consumed for driving them.

SUMMARY OF THE INVENTION

To solve the problems, the first invention presents a semiconductor memory device, wherein a pair of a first bit line and a second bit line are connected to an amplifier, the gate of a first MOS transistor for composing a main body memory cell is connected to a word line, a first electrode of a first ferrodielectric capacitor for composing the main body memory cell is connected to the source of the first MOS transistor, the drain of the first MOS transistor is connected to the first bit line, and the second electrode of the first ferrodielectric capacitor is connected to a first plate electrode, the gate of a second MOS transistor for composing a dummy memory cell is connected to the dummy word line, the first electrode of a second ferrodielectric capacitor for composing the dummy memory cell is connected to the source of the second MOS transistor, the drain of the second MOS transistor is connected to the second bit line, and the second electrode of the second ferrodielectric capacitor is connected to a second plate electrode, whereby the logic voltage of the second plate electrode is inverted after turning off the second MOS transistor for composing the dummy memory cell.

The second invention presents a semiconductor memory device according to the first invention, wherein the second MOS transistor for composing the dummy memory cell is turned off, and the logic voltage of the first and second plate electrodes is inverted, and the first MOS transistor for composing the main body memory cell is turned off.

The third invention presents a semiconductor memory device according to the second invention, wherein the first plate electrode is connected to the second plate electrode.

The fourth invention presents a semiconductor memory device according to the first invention, wherein the second bit line is set to a certain logic voltage after reading or writing action of the memory cell data, the second MOS transistor is turned on, and the logic voltage of the second plate electrode is set at a reverse logic voltage of the logic voltage of the second bit line.

The fifth invention presents a semiconductor memory device, wherein a pair of a first bit line and a second bit line are connected to an amplifier, the gate of a first MOS transistor for composing a main body memory cell is connected to a word line, a first electrode of a first ferrodielectric capacitor for composing the main body memory cell is connected to the source of the first MOS transistor, the drain of the first MOS transistor is connected to the first bit line, a second electrode of the first ferrodielectric capacitor is connected to a first plate electrode, the gate of a second MOS transistor for composing a dummy memory cell is connected to a dummy word line, a first electrode of a second ferrodielectric capacitor for composing the dummy memory cell is connected to the source of the second MOS transistor, the drain of the second MOS transistor is connected to a second bit line, a second electrode of the second ferrodielectric capacitor is connected to a second plate electrode, the gate of a third MOS transistor is connected to a dummy memory cell data initialization control signal wire, the drain of the third MOS transistor is connected to the first electrode of the second ferrodielectric capacitor, and the source of the third MOS transistor is connected to a dummy memory cell data initializing potential signal wire.

The sixth invention presents a semiconductor memory device according to the fifth invention, wherein the first plate electrode is connected to the second plate electrode.

The seventh invention presents a semiconductor memory device according to the fifth invention, wherein the dummy memory cell data initializing potential signal wire is connected to the ground potential.

The eighth invention presents a semiconductor memory device according to the fifth invention, wherein the logic voltage of the first bit line and second bit line before start of reading or writing action of data of memory cell is the ground potential.

The ninth invention presents a semiconductor memory device according to the fifth invention, wherein after turning off the second MOS transistor for composing the dummy memory cell, the third MOS transistor is turned on, and the third MOS transistor is turned on, and then the logic voltage of the first and second plate electrode is inverted, and the first MOS transistor for composing the main body memory cell is turned off.

The tenth invention presents a semiconductor memory device according to the first or fifth invention, wherein the logic voltage of the first plate electrode is inverse logic voltage of the logic voltage of the first bit line before start of reading action of data of the memory cell.

The eleventh invention presents a semiconductor memory device according to the first or fifth invention, wherein the logic voltage of the second plate electrode and the logic voltage of the first electrode of the second ferrodielectric capacitor are inverse logic voltage of the logic voltage of the second bit line before start of reading action of the memory cell.

The twelfth invention presents a semiconductor memory device according to the first or fifth invention, wherein the logic voltage of the second plate electrode and the logic voltage of the second bit line are inverse logic voltage of the logic voltage of the first electrode of the second ferrodielectric capacitor before start of reading action of the memory cell.

The thirteenth invention presents a semiconductor memory device according to the tenth, eleventh or twelfth invention, wherein the logic voltage of the first plate electrode is always the same, or the logic voltage of the second plate electrode is always the same.

The fourteenth invention presents a semiconductor memory device according to the first or fourth invention, wherein the logic voltage of the first and second plate electrodes is inverted after turning on the first MOS transistor for composing the main body memory, and the second MOS transistor for composing the dummy memory cell.

The fifteenth invention presents a semiconductor memory device according to the first or fourth invention, wherein after turning on the first MOS transistor for composing the main body memory, and the second MOS transistor for composing the dummy memory cell, precharging of the first and second bit lines at one logic voltage is terminated before start of reading or writing action of data of the memory cell, and then the logic voltage of the first and second plate electrodes is inverted.

The sixteenth invention presents a semiconductor memory device according to the first or fourth invention, wherein after inverting the logic voltage of the first and second plate electrodes, the first MOS transistor for composing the main body memory cell and the second MOS transistor for composing the dummy memory cell are turned on.

In the semiconductor memory device having such constitution and operation, the dummy memory cell capacitor can be initialized, and malfunction in reading is eliminated. Besides, the state of the dummy memory cell capacitor after reading the data can be securely set to the initial state, and malfunction in reading does not occur. A semiconductor memory device without concentration of power consumption is also realized.

DESCRIPTION OF THE PREFERRED EMBODIMENTS (First embodiment)

Figure 1:
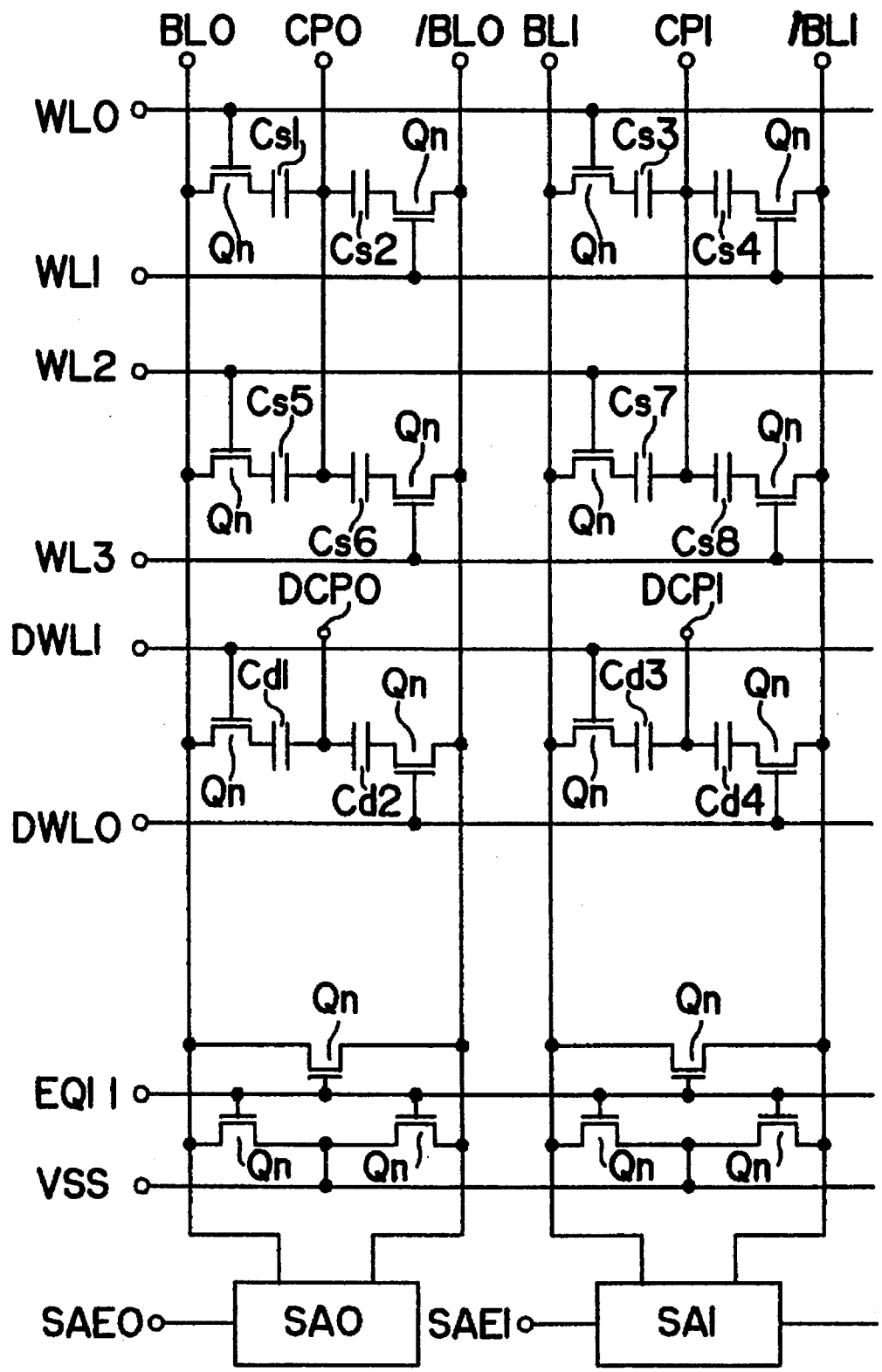
FIG. 1 is a diagram showing a circuit configuration of a first embodiment of a semiconductor memory device of the invention.

FIG. 1 shows a first embodiment of the invention.

A main body memory cell is composed of main body memory cell ferrodielectric capacitors Cs1 to Cs8, and N-channel type MOS transistors Qn having word lines WL0 to WL3 connected to the gates thereof. The first electrodes of the main body memory cell ferrodielectric capacitors Cs1 to Cs8 are connected to the sources of the N-channel type MOS transistors Qn. The second electrodes of the main body memory cell ferrodielectric capacitors Cs1 to Cs8 are connected to either cell plate electrode CP0 or CP1. The drains of the N-channel type MOS transistors Qn composing the main body memory cell are connected to any one of bit lines BL0, /BL0, BL1, /BL1. A dummy memory cell is similarly composed of dummy memory cell ferrodielectric capacitors Cd1 to Cd4, and N-channel type MOS transistors Qn having dummy word lines DWL0 to DWL1 connected to the gates thereof. The first electrodes of the dummy memory cell ferrodielectric capacitors Cd1 to Cd4 are connected to the sources of the N-channel type MOS transistors Qn. The second electrodes of the dummy memory cell ferrodielectric capacitors Cd1 to Cd4 are connected to either one of dummy cell plate electrodes DCP0 and DCP1. The drains of the N-channel type MOS transistors Qn for composing the dummy memory cell are connected to any one of bit lines BL0, /BL0, BL1, /BL1. The sets of bit lines BL0 and /BL0, and BL1 and /BL1 are respectively connected to the sense amplifiers SA0, SA1. The sense amplifiers SA0, SA1 are controlled by sense amplifier control signals SAE0, SAE1, respectively, and they operate when SAE0, SAE1 are logic voltage H. The bit lines BL0 and /BL0, and BL1 and /BL1 are connected through the N-channel type MOS transistors Qn having bit line equalizing and precharging control signals EQ11 applied to the gates thereof, and the bit lines BL0, /BL0, BL1, and /BL1 are connected to a grounding voltage VSS through the N-channel type MOS transistors Qn having bit line equalizing and precharging control signals EQ11 applied to the gates thereof.

Figure 2:
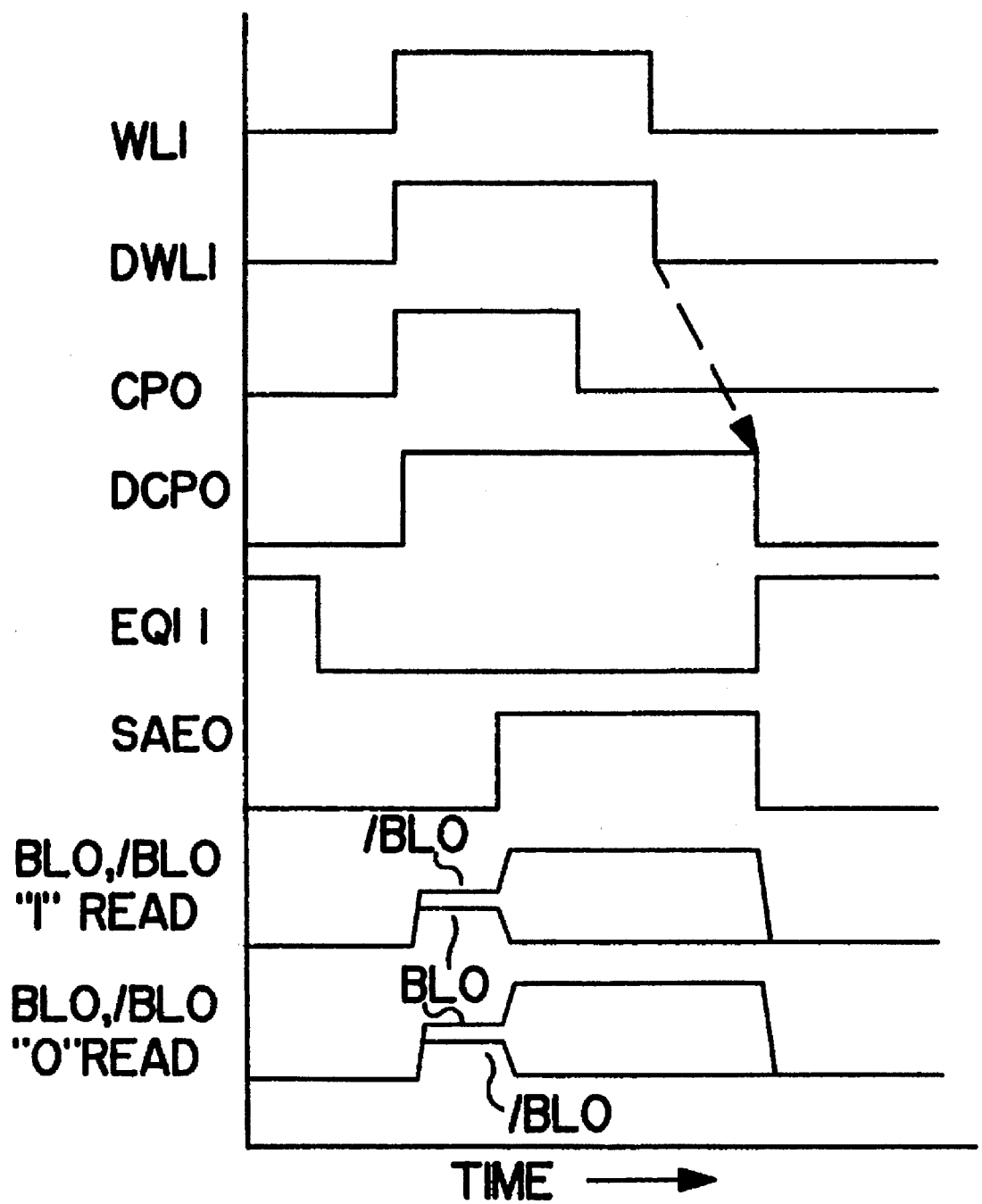
FIG. 2 is a diagram showing the operation timing in the first embodiment of the semiconductor memory device of the invention.

FIG. 2 is an operation timing chart of the first embodiment. The ferrodielectric element of the main body memory cell capacitor possesses the hysteresis characteristic shown in FIG. 26, and the retrodielectric element of the dummy memory cell capacitor possesses the hysteresis characteristic shown in FIG. 27.

Herein, to read out the data of the main body memory cell, as the initial state, the word lines, dummy word lines, cell plate electrodes, dummy cell plate electrodes, and sense amplifier control signals are set at logic voltage L, while bit line equalizing and precharging control signals EQ11 are set at logic voltage H, and the bit lines at logic voltage L. Afterwards, the bit line equalizing and precharging control signals EQ11 are set at logic voltage L, and the bit lines are set in floating state. Consequently, to read out the data of the main body memory cell capacitor Cs2, when the word line WL1, dummy word line DWL1, cell plate electrode CP0, and dummy cell plate electrode DCP0 are set at logic voltage H, the data in the dummy memory cell is read out into the bit line BL0, and the data of the main body memory cell is read out in the bit line /BL0. At this time, when the data of the main body memory cell is 1, changing from the state of point B to the state of point D in FIG. 26, the electric charge Q1 is readout in the bit line. When the data of the main body memory cell is 0, changing from the state of point E to the state of point D in FIG. 26, the electric charge Q0 is read out in the bit line. At this time, the dummy memory cell changes from the state at point K to the state at point J in FIG. 27, and the electric charge Qd is read out in the bit line. Then, setting the sense amplifying control signal SAE0 at logic voltage H, the sense amplifier SA0 is operated, and the data being read out in the bit lines BL0, /BL0 are amplified. Next, the cell plate electrode CP0 is set at the logic voltage L. At this time, when the data of the main body memory cell is 1, it comes to be in the state of point A in FIG. 26. When the data of the main body memory cell is 0, the state is point E in FIG. 26.

The word line WL1 and dummy word line DWL1 are set at logic voltage L. At this time, if the data of the main body memory cell is 1, it comes to be in the state of point A or point B in FIG. 26, or when the data of the main body memory cell is 0, it becomes the state of point E in FIG. 26.

Next, the dummy cell plate electrode CP0 is set at logic voltage L, the sense amplifier control signal SAE0 at logic voltage L, the bit line equalizing and precharging control signal EQ11 at logic voltage H, and the bit line at logic voltage L.

Figure 27:
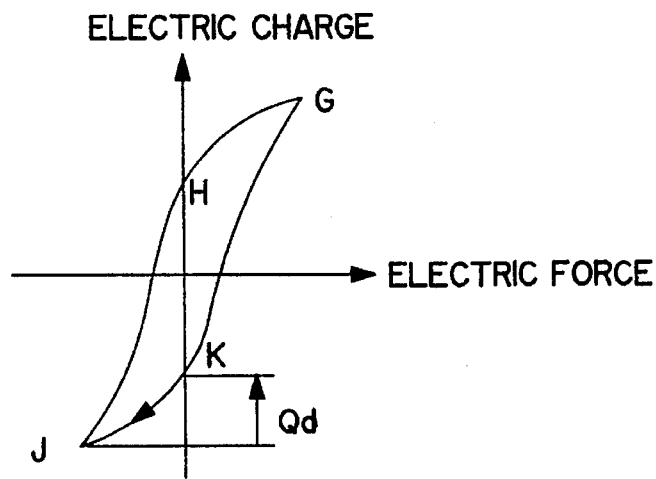
FIG. 27 is a diagram showing the hysteresis characteristic of ferrodielectric element of a dummy memory cell capacitor used in a conventional semiconductor memory device.

It is a feature of the first embodiment that the initial state of the dummy memory cell can be securely set in the state at point K in FIG. 27, by setting the dummy cell plate electrode at logic voltage L after setting the dummy word line at logic voltage L. Therefore, malfunction does not occur at the next time of data reading. Incidentally, if the dummy word line is set to logic voltage L after setting the dummy cell plate electrode at logic voltage L, in the case that the main body memory cell data is 0, when the dummy cell plate electrode becomes logic voltage L, the dummy memory cell is in the state of point G in FIG. 27. When the dummy word line comes to logic voltage L, the dummy memory cell is in the state of point G or point H in FIG. 27. Thus, since the initial state of the dummy memory cell is not the state or point K in FIG. 27, malfunction occurs at the next time of data reading.

(Second embodiment)

Figure 3:
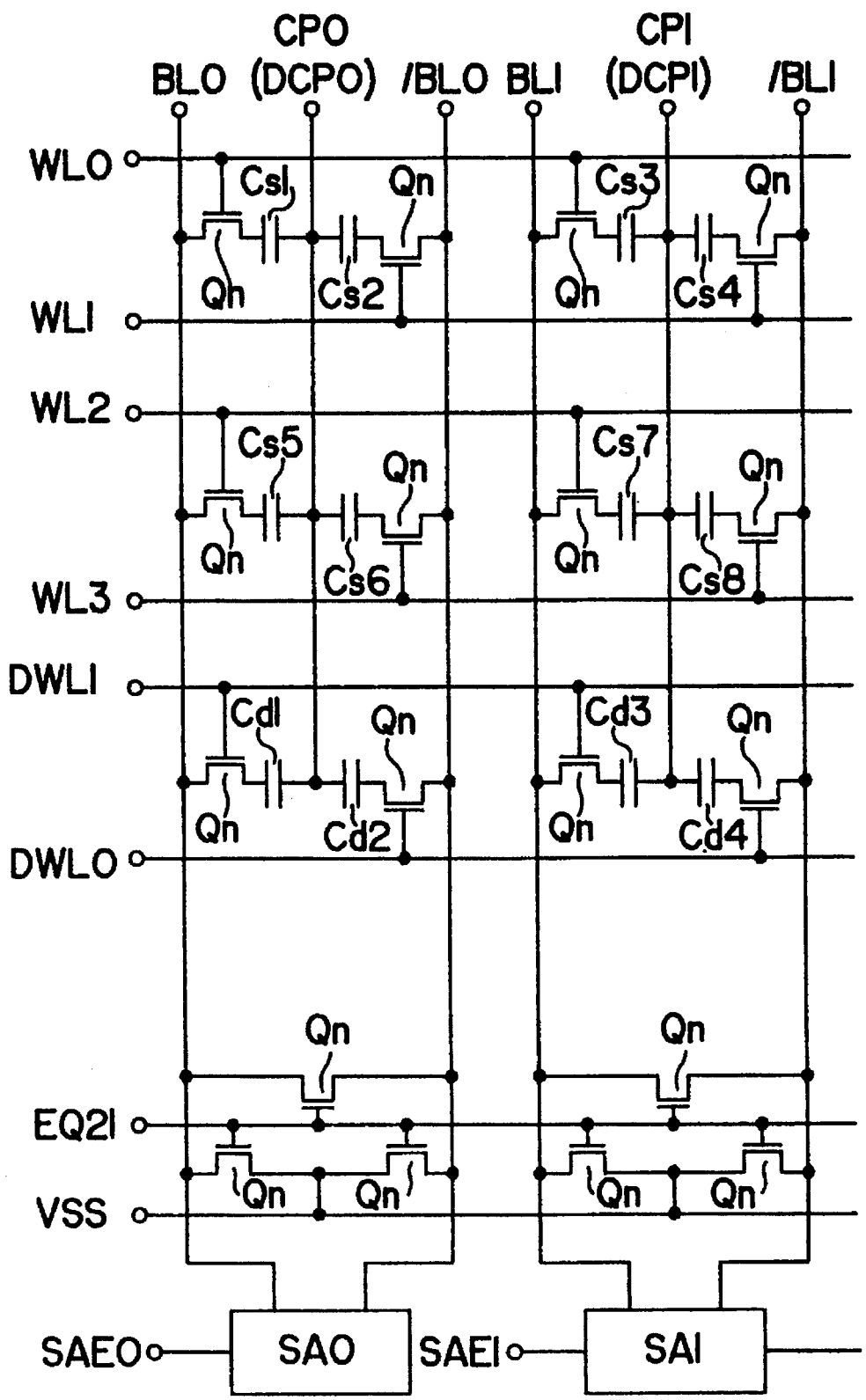
FIG. 3 is a diagram showing a circuit configuration of a second embodiment of a semiconductor memory device of the invention.

FIG. 3 shows a second embodiment.

A main body memory cell is composed of main body memory cell ferrodielectric capacitors Cs1 to Cs8, and N-channel type MOS transistors Qn having word lines WL0 to WL3 connected to the gates thereof. The first electrodes of the main body memory cell ferrodielectric capacitors Cs1 to Cs8 are connected to the sources of the N-channel type MOS transistors Qn, and the second electrodes of the main body memory cell ferrodielectric capacitors Cs1 to Cs8 are connected to either cell plate electrode CP0 (DCP0) or CP1 (DCP1). The drains of the N-channel type MOS transistors Qn composing the main body memory cell are connected to any one of bit lines BL0, /BL0, BL1, /BL1. A dummy memory cell is similarly composed of dummy memory cell ferrodielectric capacitors Cd1 to Cd4, and N-channel type MOS transistors Qn having dummy word lines DWL0 to DWL1 connected to the gates thereof. The first electrodes of the dummy memory cell ferrodielectric capacitors Cd1 to Cd4 are connected to the sources of the N-channel type MOS transistors Qn, and the second electrodes of the dummy memory cell ferrodielectric capacitors Cd1 to Cd4 are connected to either one of cell plate electrodes CP0 (DCP0) and CP1 (DCP1). The drains of the N-channel type MOS transistors Qn for composing the dummy memory cell are connected to any one of bit lines BL0, /BL0, BL1, /BL1. The sets of bit lines BL0 and /BL0, and BL1 and /BL1 are respectively connected to the sense amplifiers SA0, SA1. The sense amplifiers SA0, SA1 are controlled by sense amplifier control signals SAE0, SAE1, respectively, and they operate when SAE0, SAE1 are logic voltage H. The bit lines BL0 and /BL0, and BL1 and /BL1 are connected through the N-channel type MOS transistors Qn having bit line equalizing and precharging control signals EQ21 applied to the gates thereof. The bit lines BL0, /BL0, BL1, and /BL1 are connected to a grounding voltage VSS through the N-channel type MOS transistors Qn having bit line equalizing and precharging control signals EQ21 applied to the gates thereof.

Figure 4:
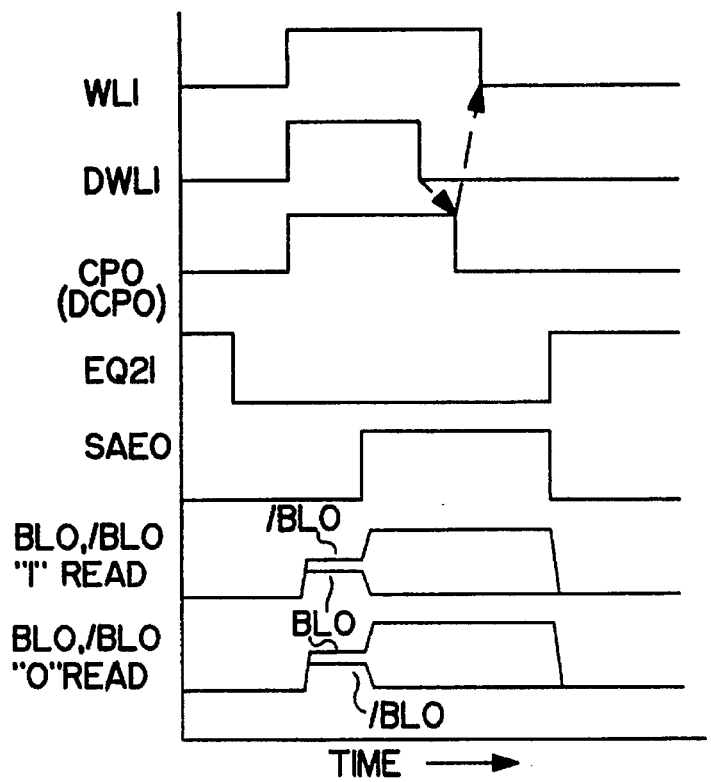
FIG. 4 is a diagram showing the operation timing in the second embodiment of the semiconductor memory device of the invention.

FIG. 4 is an operation timing chart of the second embodiment. The ferrodielectric element of the main body memory cell capacitor possesses the hysteresis characteristic shown in FIG. 26, and the ferrodielectric element of the dummy memory cell capacitor possesses the hysteresis characteristic shown in FIG. 27.

Herein, to read out the data of the main body memory cell, as the initial state, the word lines, dummy word lines, cell plate electrodes, dummy cell plate electrodes, and sense amplifier control signals are set at logic voltage L, while the bit line equalizing and precharging control signals EQ21 are set at logic voltage H, and the bit lines at logic voltage L. Afterwards, the bit line equalizing and precharging control signals EQ21 are set at logic voltage L, and the bit lines are set in floating state. Consequently, to read out the data of the main body memory cell capacitor Cs2, when the word line WL1, dummy word line DWL1, and cell plate electrode CP0 (DCP0) are set at logic voltage H, the data in the dummy memory cell is read out into the bit line BL0, and the data of the main body memory cell is read out in the bit line /BL0. At this time, when the data of the main body memory cell is 1, changing from the state of point B to the state of point D in FIG. 26, the electric charge Q1 is readout in the bit line. When the data of the main body memory cell is 0, changing from the state or point E to the state of point D in FIG. 26, the electric charge Q0 is read out in the bit line. At this time, the dummy memory cell changes from the state at point K to the state at point J in FIG. 27, and the electric charge Qd is read out in the bit line. Then, setting the sense amplifying control signal SAE0 at logic voltage H, the sense amplifier SA0 is operated, and the data being read out in the bit lines BL0, /BL0 are amplified. Next, the cell plate electrode CP0 (DCP0) is set at the logic voltage L. At this time, when the data of the main body memory cell is 1, it comes to be in the state of point A in FIG. 26. When the data of the main body memory cell is 0, the state is point E in FIG. 26. The word line WL1 is set at logic voltage L. At this time, if the data of the main body memory cell is 1, it comes to be in the state of point A or point B in FIG. 26, or when the data of the main body memory cell is 0, it becomes the state of point E in FIG. 26. Next, the sense amplifier control signal SAE0 is set at logic voltage L, the bit line equalizing and precharging control signal EQ21 at logic voltage H, and the bit line at logic voltage L.

It is a feature of the second embodiment, same as in the first embodiment, that the initial state of the dummy memory cell can be securely set in the state at point K in FIG. 27, by setting the (dummy) cell plate electrode at logic voltage L after setting the dummy word line at logic voltage L. Besides, by the operation timing in FIG. 4 as shown above, the cell plate electrode of the main body memory cell and the dummy cell plate electrode of the dummy memory cell can be commonly used.

(Third embodiment)

Figure 5:
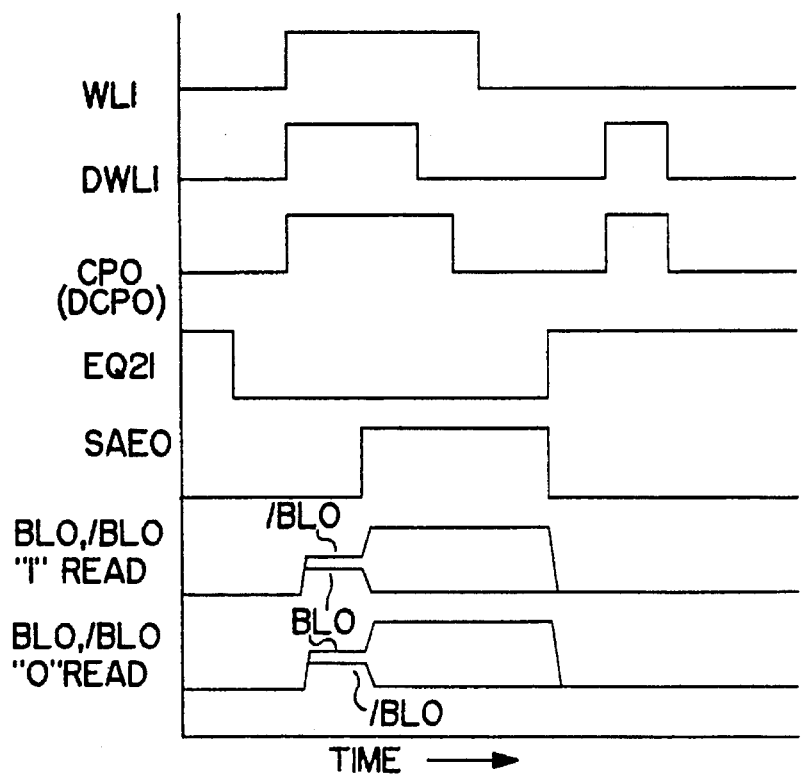
FIG. 5 is a diagram showing the operation timing in a third embodiment of a semiconductor memory device of the invention.

The circuit diagram of the third embodiment of the invention is shown in FIG. 3, which is same as that of the second embodiment. FIG. 5 shows the operation timing diagram.

The logic voltage of the sense amplifier control signal SAE0 is set to L, the bit line equalizing and precharging control signal EQ21 is set to logic voltage H, the bit line is set to logic voltage L, and reading of data of the main body memory cell is terminated. The operation is so far same as in the second embodiment. Next, as shown in FIG. 5, the dummy word line DWL1 and cell plate electrode CP0 (DCP0) are set to logic voltage H. This is the timing of initialization of the data of the dummy memory cell, and the state of the dummy memory cell is the state at point J in FIG. 27. Afterwards, by setting the cell plate electrode CP0 (DCP0) to logic voltage L and the dummy word line DWL1 to logic voltage L, the state of the dummy memory cell becomes the state at point K in FIG. 27.

It is a feature of the third embodiment that the data of the dummy memory cell can be securely initialized to the state at point K in FIG. 27, by the timing action of initialization of the data of the dummy memory cell. In particular, when turning on the power source after manufacturing the device, the dummy memory cell may not be always in the initial sate, and this is used in such a case.

In the first and second embodiments, since the dummy memory cell is initialized at the last step of a series of action timing of reading of data, the dummy memory cell cannot be initialized without performing reading action.

(Fourth embodiment)

Figure 6:
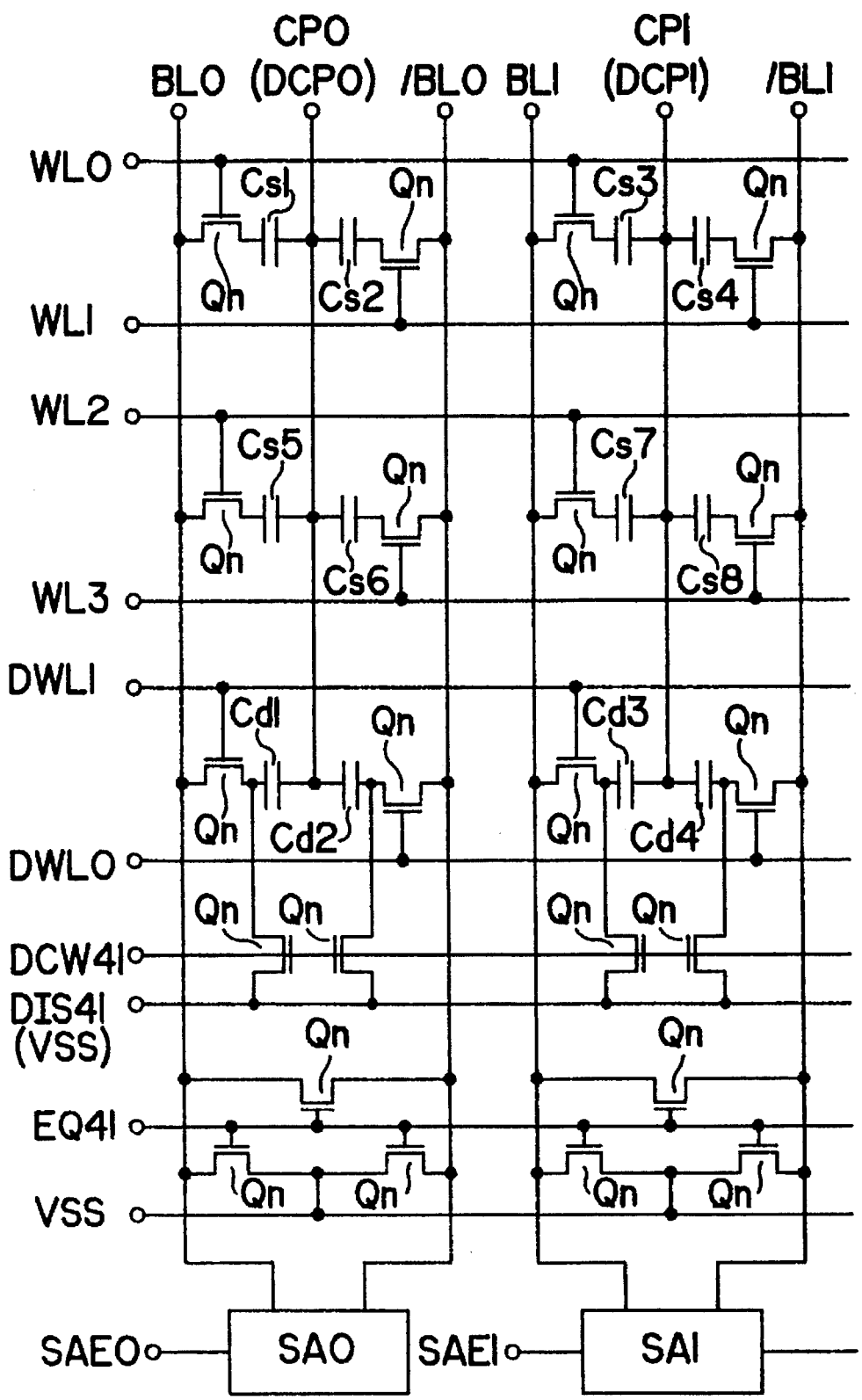
FIG. 6 is a diagram showing a circuit configuration of a fourth embodiment of a semiconductor memory device of the invention.

FIG. 6 shows the fourth embodiment.

Same as in the second embodiment, the main body memory cell is composed of main body memory cell ferrodielectric capacitors Cs1 to Cs8, and N-channel type MOS transistors Qn having word lines WL0 to WL3 connected to the gates thereof. The first electrodes of the main body memory cell ferrodielectric capacitors Cs1 to Cs8 are connected to the sources of the N-channel type MOS transistors Qn, and the second electrodes of the main body memory cell ferrodielectric capacitors Cs1 to Cs8 are connected to either cell plate electrode CP0 (DCP0) or CP1 (DCP1). The drains of the N-channel type MOS transistors Qn composing the main body memory cell are connected to any one of bit lines BL0, /BL0, BL1, /BL1. A dummy memory cell is similarly composed of dummy memory cell ferrodielectric capacitors Cd1 to Cd4, and N-channel type MOS transistors Qn having dummy word lines DWL0 to DWL1 connected to the gates thereof. The first electrodes of the dummy memory cell ferrodielectric capacitors Cd1 to Cd4 are connected to the sources of the N-channel type MOS transistors Qn, and the second electrodes of the dummy memory cell ferrodielectric capacitors Cd1 to Cd4 are connected to either one of cell plate electrodes CP0 (DCP0) and CP1 (DCP1). The first electrodes of the dummy memory cell ferrodielectric capacitors Cd1 to Cd4 are connected to a data initializing potential signal line DIS41 through the N-channel type MOS transistors Qn, which is a dummy memory call data initializing control signal DCW41, at the gate. In this embodiment, the data initializing potential signal line is connected to the grounding voltage VSS. The drains of the N-channel type MOS transistors Qn for composing the dummy memory cell are connected to any one of bit lines BL0, /BL0, BL1, /BL1. The sets of bit lines BL0 and /BL0, and BL1 and /BL1 are respectively connected to the sense amplifiers SA0, SA1. The sense amplifiers SA0, SA1 are controlled by sense amplifier control signals SAE0, SAE1, respectively, and they operate when SAE0, SAE1 are logic voltage H. The bit lines BL0 and /BL0, and BL1 and /BL1 are connected through the N-channel type MOS transistors Qn having bit line equalizing and precharging control signals EQ41 applied to the gates thereof. The bit lines BL0, /BL0, BL1, and /BL1 are connected to a grounding voltage VSS through the N-channel type MOS transistors Qn having bit line equalizing and precharging control signals EQ41 applied to the gates thereof.

Figure 7:
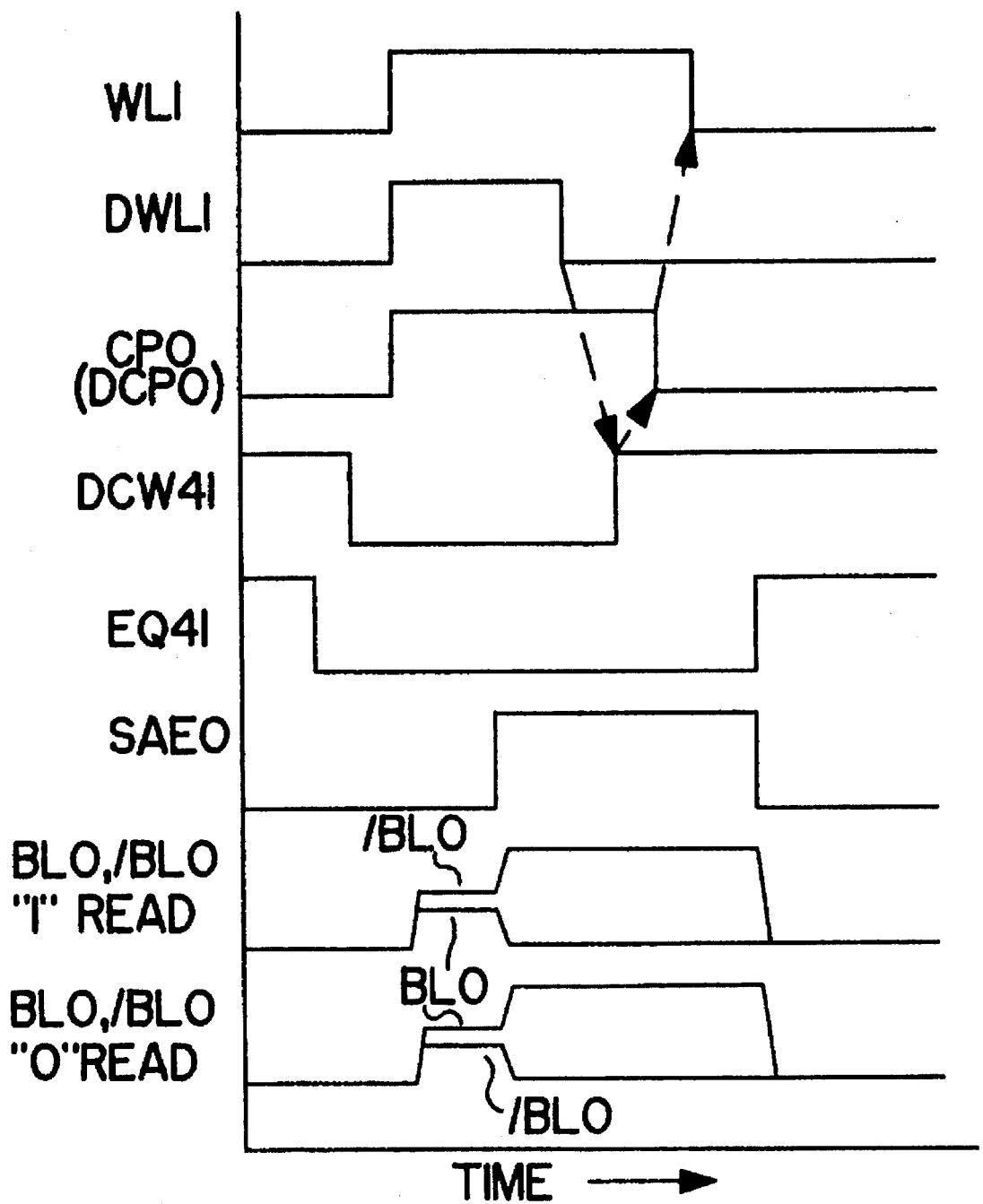
FIG. 7 is a diagram showing the operation timing in the fourth embodiment of the semiconductor memory device of the invention.
Figure 26:
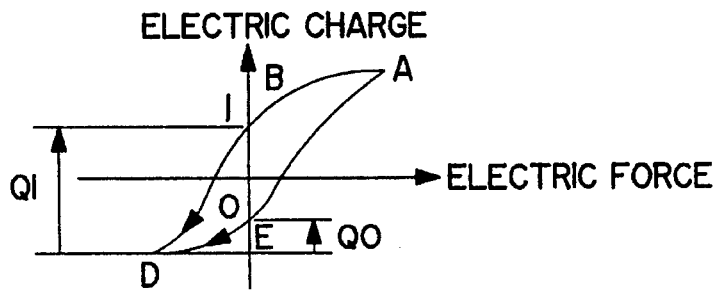
FIG. 26 is a diagram showing the hysteresis characteristic of ferrodielectric element of a main body memory cell capacitor used in a conventional semiconductor memory device.

FIG. 7 is a diagram showing the operation timing of the fourth embodiment. The ferrodielectric element of the main body memory capacitor possesses the hysteresis characteristic as shown in FIG. 26, and the ferrodielectric element of the dummy memory cell capacitor presents the hysteresis characteristic as shown in FIG. 27.

Herein, to read the data of the main body memory cell, as initial state, the word line, dummy word line, cell plate electrode, dummy cell plate electrode, and sense amplifier control signal are set to logic voltage L, the dummy memory cell data initializing control signal DCW41 at logic voltage H, and the data of the dummy memory cell at initial state of K in FIG. 27. The bit line equalizing and precharging control signal EQ41 is set at logic voltage H, and the bit line at logic voltage L. Later, the bit line equalizing and precharging control signal EQ41 is set at logic voltage L, and the bit line is set in floating state. The dummy memory cell data initializing control signal DCW41 is set at logic voltage L, and the first electrode of the dummy memory cell ferrodielectric capacitor is set in floating state. When the word line WL1, dummy word line DWL 1, and cell plate electrode CP0 (DCP0) are set at logic voltage H, the data of the dummy memory cell is read out in bit line BL0, and the data of the main body memory cell is read out in bit line /BL0. At this time, when the data of the main body memory cell is 1, the state at point B in FIG. 26 is changed to the state at point D, and the electric charge Q1 is read out in the bit line. When the data of the main body memory is 0, the state at point E in FIG. 26 is changed to the state at point D, and the electric charge Q0 is read out in the bit line. At this time, the dummy memory cell is changed from the state of point K to the state of point J in FIG. 27, and the electric charge Qd is read out in the bit line. Afterwards, the sense amplifier control signal SAE0 is set at logic voltage H to operate the sense amplifier SA0, and the data being read out in the bit lines BL0, /BL0 is amplified. Then, the dummy word line DWL1 is set at logic voltage L. Next, the dummy memory cell data initializing control signal DCW41 is set at logic voltage H, and the dummy memory cell is set in the state of point J in FIG. 17. The cell plate electrode CP0 (DCP0) is set at logic voltage L. At this time, if the data of the main body memory cell is 0, the state is point A in FIG. 26. When the data of the main body memory cell is 0, the state is point E in FIG. 26, and the dummy memory cell is in the state of point K in FIG. 27. Consequently, the word line WL1 is set at logic voltage L. At this time, when the data of the main body memory cell is 1, the state is either point A or point B in FIG. 26. When the data of the main body memory cell is 0, the state is point E in FIG. 26. The sense amplifier control signal SAE0 is set at logic voltage L, the bit line equalizing and precharging control signal EQ21 is set at logic voltage H, and the bit line is set at logic voltage L.

It is a feature of the fourth embodiment that the initial state of the dummy memory cell can be set to the state of point K in FIG. 27, by controlling the state of the first electrode of the dummy memory cell ferrodielectric capacitor by the dummy memory cell data initializing control signal DCW41. In the fourth embodiment, after fixing the state of the first electrode of the dummy memory cell ferrodielectric capacitor at the grounding voltage VSS (logic voltage L), the cell plate electrode CP0 (DCP0) is set at logic voltage L, so that the initial state of the dummy memory cell can be securely set to the state of point K in FIG. 27. That is, in the first and second embodiments, while the first electrode of the dummy memory cell ferrodielectric capacitor is in floating state at logic voltage H, the cell plate electrode CP0 (DCP0) is set at logic voltage L, and therefore when the cell plate electrode CP0 (DCP0) is changed by a certain potential, the first electrode is in floating state, and it may not change by the same potential. To the contrary, in the fourth embodiment, since the first electrode of the memory cell and the cell plate electrode are both set at the grounding potential, the potentials are the same unless there is potential difference between the two electrodes.

In the fourth embodiment, moreover, the precharging potential of the bit line is the grounding voltage VSS (logic voltage L), and the initial state of the first electrode of the dummy memory cell ferrodielectric capacitor is at the grounding voltage VSS (logic voltage L), so that the power consumption when initializing upon turning on the device power source is saved. Since the bit line and memory capacitor possess the capacity C, if the precharging potential and the initial state of the first electrode of the capacitor are at the supply voltage (VCC), the power consumption for feeding the electric charge of C x VCC occurs.

(Fifth embodiment)

Figure 8:
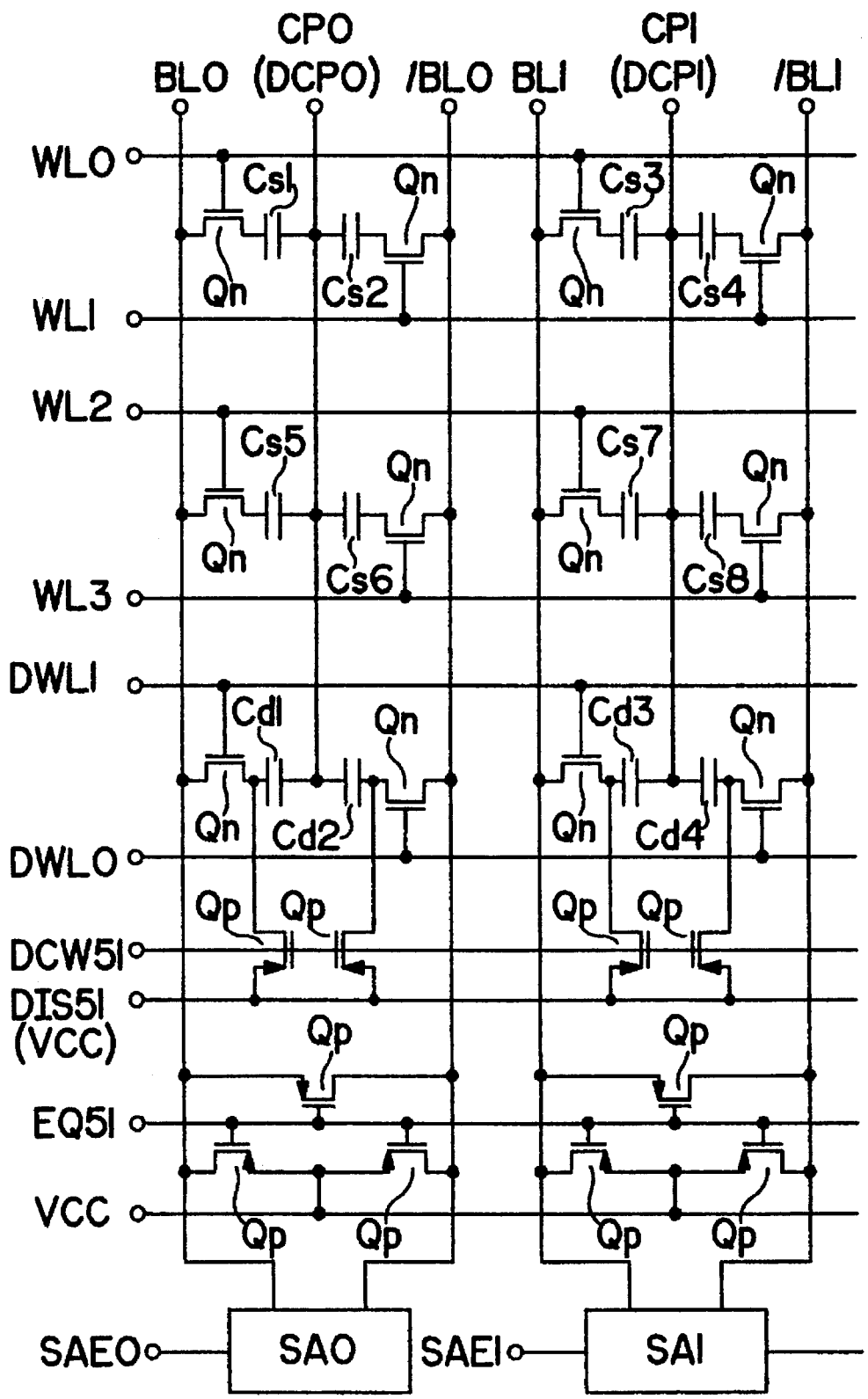
FIG. 8 is a diagram showing a circuit configuration of a fifth embodiment of a semiconductor memory device of the invention.

FIG. 8 shows the fifth embodiment of the invention.

The fifth embodiment is same as the fourth embodiment in the circuit configuration, but is opposite to the fourth embodiment in the logic voltage of the initial state of the bit line, cell place electrode and dummy memory cell.

The main body memory cell is composed of main body memory cell ferrodielectric capacitors Cs1 to Cs8, and N-channel type MOS transistors Qn having word lines WL0 to WL3 connected to the gates thereof. The first electrodes of the main body memory cell ferrodielectric capacitors Cs1 to Cs8 are connected to the sources of the N-channel type MOS transistors Qn, and the second electrodes of the main body memory cell ferrodielectric capacitors Cs1 to Cs8 are connected to either cell plate electrode CP0 (DCP0) or CP1 (DCP1). The drains of the N-channel type MOS transistors Qn composing the main body memory cell are connected to any one of bit lines BL0, /BL0, BL1, /BL1. A dummy memory cell is similarly composed of dummy memory cell ferrodielectric capacitors Cd1 to Cd4, and N-channel type MOS transistors Qn having dummy word lines DWL0 to DWL1 connected to the gates thereof. The first electrodes of the dummy memory cell ferrodielectric capacitors Cd1 to Cd4 are connected to the sources of the N-channel type MOS transistors Qn, and the second electrodes of the dummy memory cell ferrodielectric capacitors Cd1 to Cd4 are connected to either one of cell plate electrodes CP0 (DCP0) and CP1 (DCP1). The first electrodes of the dummy memory cell ferrodielectric capacitors Cd1 to Cd4 are connected to a data initializing potential signal line DIS51 through the N-channel type MOS transistors Qn, which is a dummy memory cell data initializing control signal DCW51, at the gate. In this embodiment, the data initializing potential signal line is connected to the grounding voltage VSS. The drains of the N-channel type MOS transistors Qn for composing the dummy memory cell are connected to any one of bit lines BL0, /BL0, BL1, /BL1. The sets of bit lines BL0 and /BL0, and BL1 and /BL1 are respectively connected to the sense amplifiers SA0, SA1. The sense amplifiers SA0, SA1 are controlled by sense amplifier control signals SAE0, SAE1, respectively, and they operate when SAE0, SAE1 are logic voltage H. The bit lines BL0 and /BL0, and BL1 and /BL1 are connected through the N-channel type MOS transistors Qn having bit line equalizing and precharging control signals EQ51 applied to the gates thereof. The bit lines BL0, /BL0, BL1, and /BL1 are connected to a grounding voltage VSS through the N-channel type MOS transistors Qn having bit line equalizing and precharging control signals EQ51 applied to the gates thereof.

Figure 9:
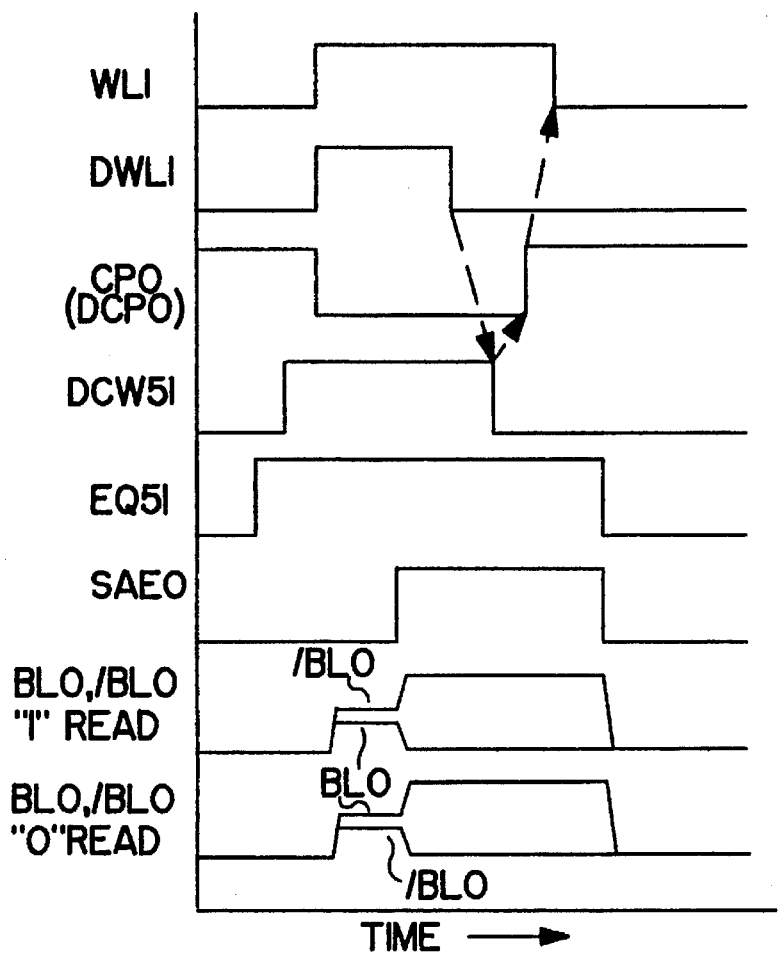
FIG. 9 is a diagram showing the operation timing in the fifth embodiment of the semiconductor memory device of the invention.
Figure 10:
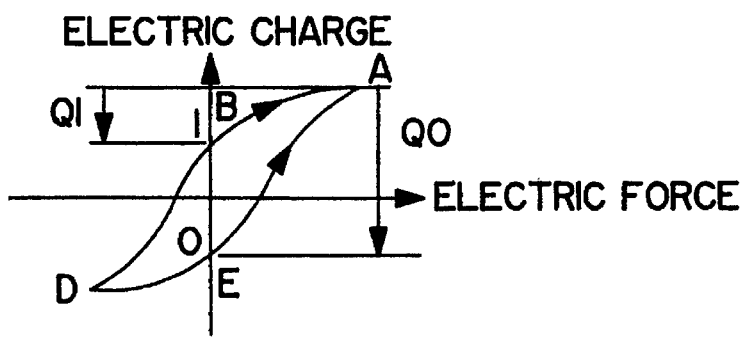
FIG. 10 is a diagram showing the hysteresis characteristic of ferrodielectric element of a main body memory cell capacitor used in the fifth embodiment of the semiconductor memory device of the invention.
Figure 11:
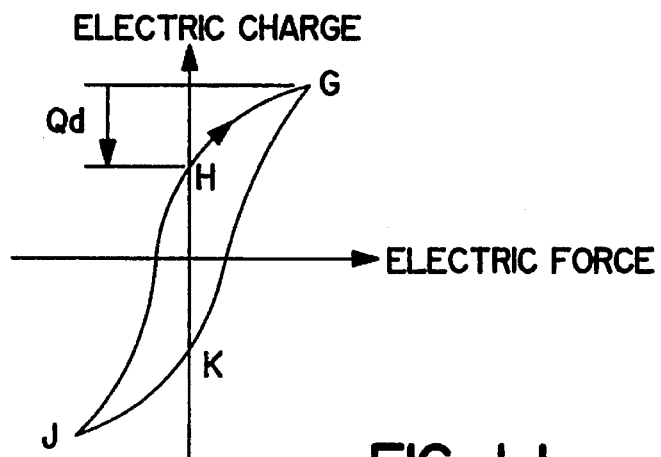
FIG. 11 is a diagram showing the hysteresis characteristic of ferrodielectric element of a dummy memory cell capacitor used in the fifth embodiment of the semiconductor memory device of the invention.

FIG. 9 is a diagram showing the operation timing of the fifth embodiment. FIG. 10 is a diagram showing the hysteresis characteristic of ferrodielectric element of the main body memory cell capacitor in the semiconductor memory device, and FIG. 11 is a diagram showing the hysteresis characteristic of ferrodielectric element of the dummy memory cell capacitor.

Herein, to read the data of the main body memory cell, as initial state, the word line, dummy word line and sense amplifier control signal are set at logic voltage L, cell plate electrode and dummy cell plate electrode at logic voltage H, and the dummy memory cell data initializing control signal DCW51 at logic voltage L. At this time, the data of the dummy memory cell at initial state of point H in FIG. 11. The bit line equalizing and precharging control signal EQ51 is set at logic voltage L, and the m-bit line at logic voltage H. Later, the bit line equalizing and precharging control signal EQ51 is set at logic voltage H, and the bit line is set in floating state. The dummy memory cell data initializing control signal DCW51 is set at logic voltage H, and the first electrode of the dummy memory cell ferrodielectric capacitor is set in floating state. Next, to read out the data of the main body memory cell capacitor Cs2, when the word line WL1 and dummy word line DWL1 are set at logic voltage H, and cell plate electrode CP0 (DCP0) is set at logic voltage L, the data of the dummy memory cell is read out in bit line BL0, and the data of the main body memory cell is read out in bit ling /BL0. At this time, when the data of the main body memory cell is 1, the state at point B in FIG. 10 is changed to the state at point A, and the electric charge Q1 is read out in the bit line. When the data of the main body memory cell is 0, the state at point E in FIG. 10 is changed to the state at point A, and the electric charge Q0 is read out in the bit line. At this time, the dummy memory cell is changed from the state of point H to the state of point G in FIG. 11, and the electric charge Qd is read out in the bit line. Afterwards, the sense amplifier control signal SAE0 is set at logic voltage H to operate the sense amplifier SA0, and the data being read out in the bit lines BL0, /BL0 is amplified. Then, the dummy word line DWL1 is set at logic voltage L. Next, the dummy memory cell data initializing control signal DCW51 is set at logic voltage L, and the dummy memory cell is set in the state of point G in FIG. 11.

The cell plate electrode CP0 (DCP0) is set at logic voltage H. At this time, if the data of the main body memory cell is 1, the state is point A in FIG. 10. When the data of the main body memory cell is 0, the state is point D in FIG. 10, and the dummy memory cell is in the state of point H in FIG. 11.

Consequently, the word line WL1 is set at logic voltage L. At this time, when the data of the main body memory cell is 1, the state is either point A or point B in FIG. 10. When the data of the main body memory cell is 0, the state is point E in FIG. 10. The sense amplifier control signal SAE0 is set at logic voltage L, the bit line equalizing and precharging control signal EQ51 is set at logic voltage H, and the bit line is set at logic voltage H.

It is a feature of the fifth embodiment, same as in the fourth embodiment, that the initial state of the dummy memory cell can be securely set to the state of point H in FIG. 11, by controlling the state of the first electrode of the dummy memory cell ferrodielectric capacitor by the dummy memory cell data initializing control signal DCW51.

(Sixth embodiment)

Figure 12:
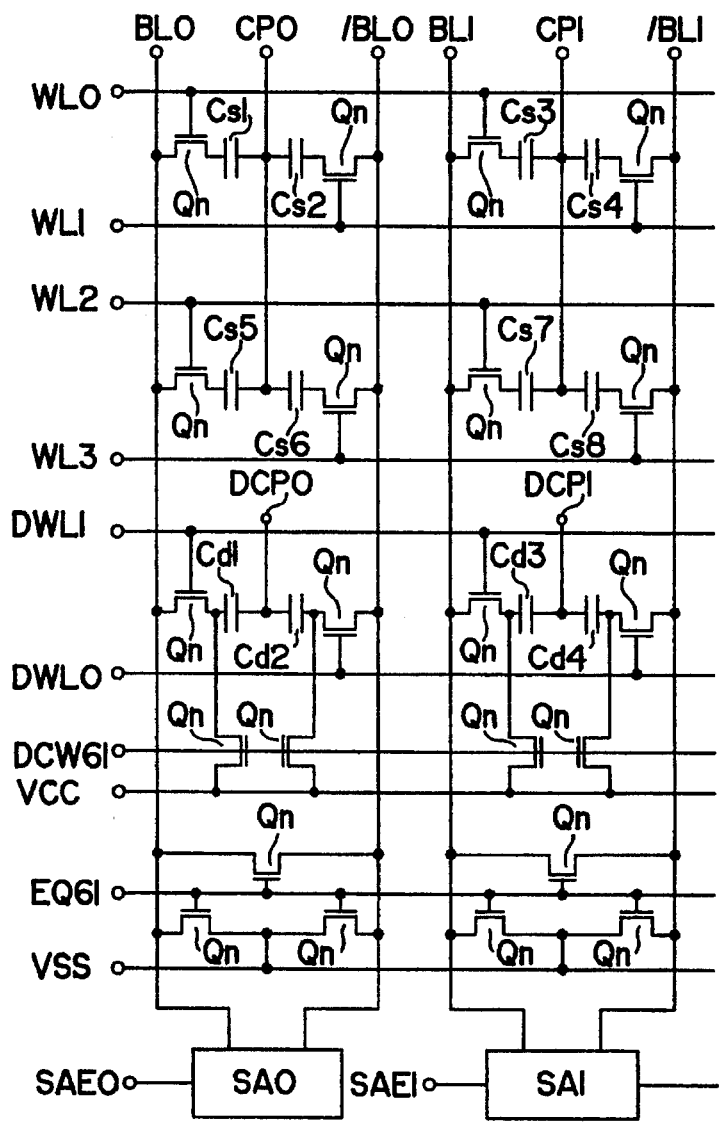
FIG. 12 is a diagram showing a circuit configuration of a sixth embodiment of a semiconductor memory device of the invention.

FIG. 12 shows the sixth embodiment of the invention.

A main body memory cell is composed of main body memory cell ferrodielectric capacitors Cs1 to Cs8, and N-channel type MOS transistors Qn having word lines WL0 to WL3 connected to the gates thereof. The first electrodes of the main body memory cell ferrodielectric capacitors Cs1 to Cs8 are connected to the sources of the N-channel type MOS transistors Qn, and the second electrodes of the main body memory cell ferrodielectric capacitors Cs1 to Cs8 are connected to either cell plate electrode CP0 or CP1. The drains of the N-channel type MOS transistors Qn composing the main body memory cell are connected to any one of bit lines BL0, /BL0, BL1, /BL1. A dummy memory cell is similarly composed of dummy memory cell ferrodielectric capacitors Cd1 to Cd4, and N-channel type MOS transistors Qn having dummy word lines DWL0 to DWL1 connected to the gates thereof. The first electrodes of the dummy memory cell ferrodielectric capacitors Cd1 to Cd4 are connected to the sources of the N-channel type MOS transistors Qn, and the second electrodes of the dummy memory cell ferrodielectric capacitors Cd1 to Cd4 are connected to either one of dummy cell plate electrodes DCP0 and DCP1. The first electrodes of the dummy memory cell ferrodielectric capacitors Cd1 to Cd4 are connected to a supply voltage VCC through the N-channel type MOS transistor Qn, which is the dummy memory cell data initializing control signal DCW61, at the gate. The drains of the N-channel type MOS transistors Qn for composing the dummy memory cell are connected to any one of bit lines BL0, /BL0, BL1, /BL1. The sets of bit lines BL0 and /BL0, and BL1 and /BL1 are respectively connected to the sense amplifiers SA0, SA1. The sense amplifiers SA0, SA1 are controlled by sense amplifier control signals SAE0, SAE1, respectively, and they operate when SAE0, SAE1 are logic voltage H. The sets of bit lines BL0 and /BL0, and BL1 and /BL1 are connected through the N-channel type MOS transistors Qn of which gates are bit line equalizing and precharging control signals EQ61. The bit lines BL0, /BL0, BL1, and /BL1 are connected to a grounding voltage VSS through the N-channel type MOS transistors Qn of which gates are bit line equalizing and precharging control signals EQ61.

Figure 13:
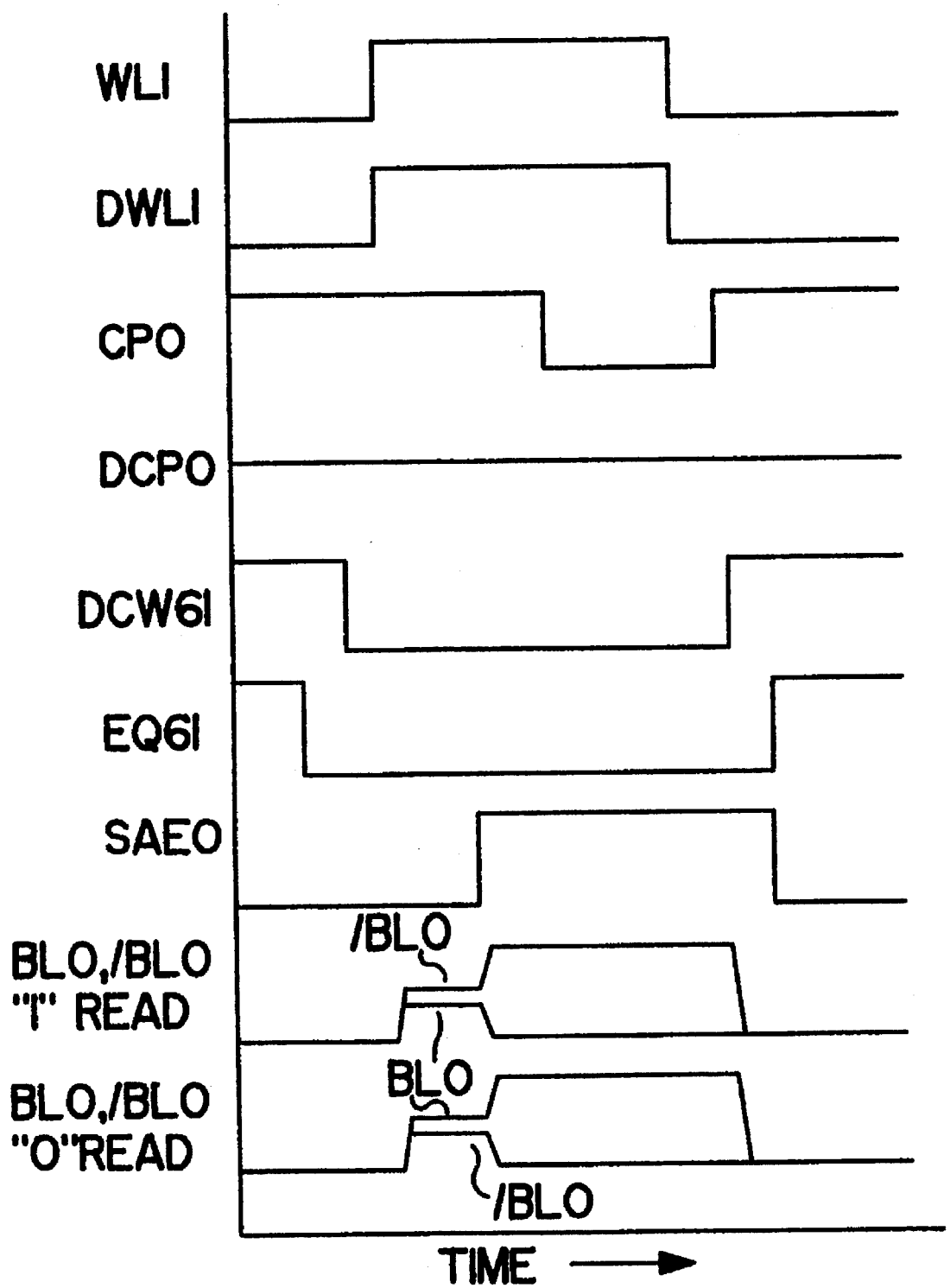
FIG. 13 is a diagram showing the operation timing in the sixth embodiment of the semiconductor memory device of the invention.

The operation of the semiconductor memory device is described while referring to the operation timing in FIG. 13. The ferrodielectric element of the main body memory cell capacitor is represented by the hysteresis characteristic shown in FIG. 26, and the ferrodielectric element of the dummy memory cell capacitor by the hysteresis characteristic shown in FIG. 27.

Herein, to read out the data of the main body memory cell, as the initial state, the word lines, dummy word lines and sense amplifier control signals are set at logic voltage L, cell plate electrodes and dummy cell plate electrodes at logic voltage H, and the dummy memory cell data initializing control signal DCW61 at logic voltage H. At this time, the data of the dummy memory cell is the state at point K in FIG. 27, which is an initial state. The bit line equalizing and precharging control signal EQ61 is set at the logic voltage H, and the bit wire is see at logic voltage L. Afterwards, the bit line equalizing and precharging control signals EQ61 are set at logic voltage L, and the bit lines are set in floating state. Furthermore, the dummy memory cell data initializing control signal DCW61 is set at logic voltage L, and the first electrode of the dummy memory cell ferrodielectric capacitor is set in floating state.

Consequently, to read out the data of the main body memory cell capacitor Cs2, the word line WL1 and dummy word line DWL1 are set at logic voltage H. As a result, the data in the dummy memory cell is read out into the bit line BL0, and the data of the main body memory cell is read out in the bit line /BL0. At this time, when the data of the main body memory cell is 1, changing from the state of point B to the state of point D in FIG. 26, the electric charge Q1 is readout in the bit line. When the data of the main body memory cell is 0, changing from the state of point E to the state of point D in FIG. 26, the electric charge Q0 is read out in the bit line. Consequently, the dummy memory cell changes from the state at point K to the state at point J in FIG. 27, and the electric charge Qd is read out in the bit line. Then, setting the sense amplifying control signal SAE0 at logic voltage H, the sense amplifier SA0 is operated, and the data being read out in the bit lines BL0, /BL0 are amplified.

Next, the cell plate electrode CP0 is set at the logic voltage L. At this time, when the data of the main body memory cell is 1, it comes to be in the state of point A in FIG. 26. When the data of the main body memory cell is 0, the state is point E in FIG. 26.

The word line WL1 and dummy word line DWL1 are set at logic voltage L, the cell plate electrode CP0 at logic voltage H, and the dummy memory cell data initializing control signal DCW61 at logic voltage H. At this time, if the data of the main body memory cell is 1, it comes to be in the state of point A or point B in FIG. 26. Or, when the data of the main body memory cell is 0, it becomes the state of point E in FIG. 26. At this time, the dummy memory cell is in the state near point K in FIG. 27. Next, the sense amplifier control signal SAE0 is set at logic voltage L, the bit line equalizing and precharging control signal EQ61 at logic voltage H, and the bit line at logic voltage L.

It is a feature of the sixth embodiment that the data can be read out from the main body memory cell and dummy memory cell directly into the bit line, when the word lines and dummy word lines are set at logic voltage H, by setting, as the initial state for reading out the data of the main body memory cell, the logic voltage of the bit lines and the logic voltage of the cell plate electrodes at opposite logic voltages in the main body memory cell, and the logic voltage of the bit lines and the logic voltage of the first electrode of the dummy memory cell ferrodielectric capacitor at opposite logic voltages in the dummy memory cell.

That is, since the cell plate has the capacity of memory cell, it takes time until the cell plate potential is changed to the logic voltage H. Accordingly, it takes a long time to read out the data. In this embodiment, to the contrary, since the cell plate electrode is initially at logic voltage H, the data can be read out immediately by setting the word line and dummy word line at logic voltage H.

In the embodiment, moreover, since the logic voltage of the dummy cell plate electrode is fixed at H, it leads to saving of power consumption.

In the sixth embodiment, the data reading electric charge of the dummy memory cell plate is the data reading electric charge Qd of the dummy memory cell of the difference between state at point K and state at point J in FIG. 27. At this time, in the curve from point K to point J, the inclination of the curve is slight near point J, and the amount of change of the electric charge for the change of electric force is small. Accordingly, if sufficient electric force is not applied when reading out, the electric charge is in saturated state for the electric force near point J. That is, the error of data reading electric charge Qd of the dummy memory cell is small.

(Seventh embodiment)

Figure 14:
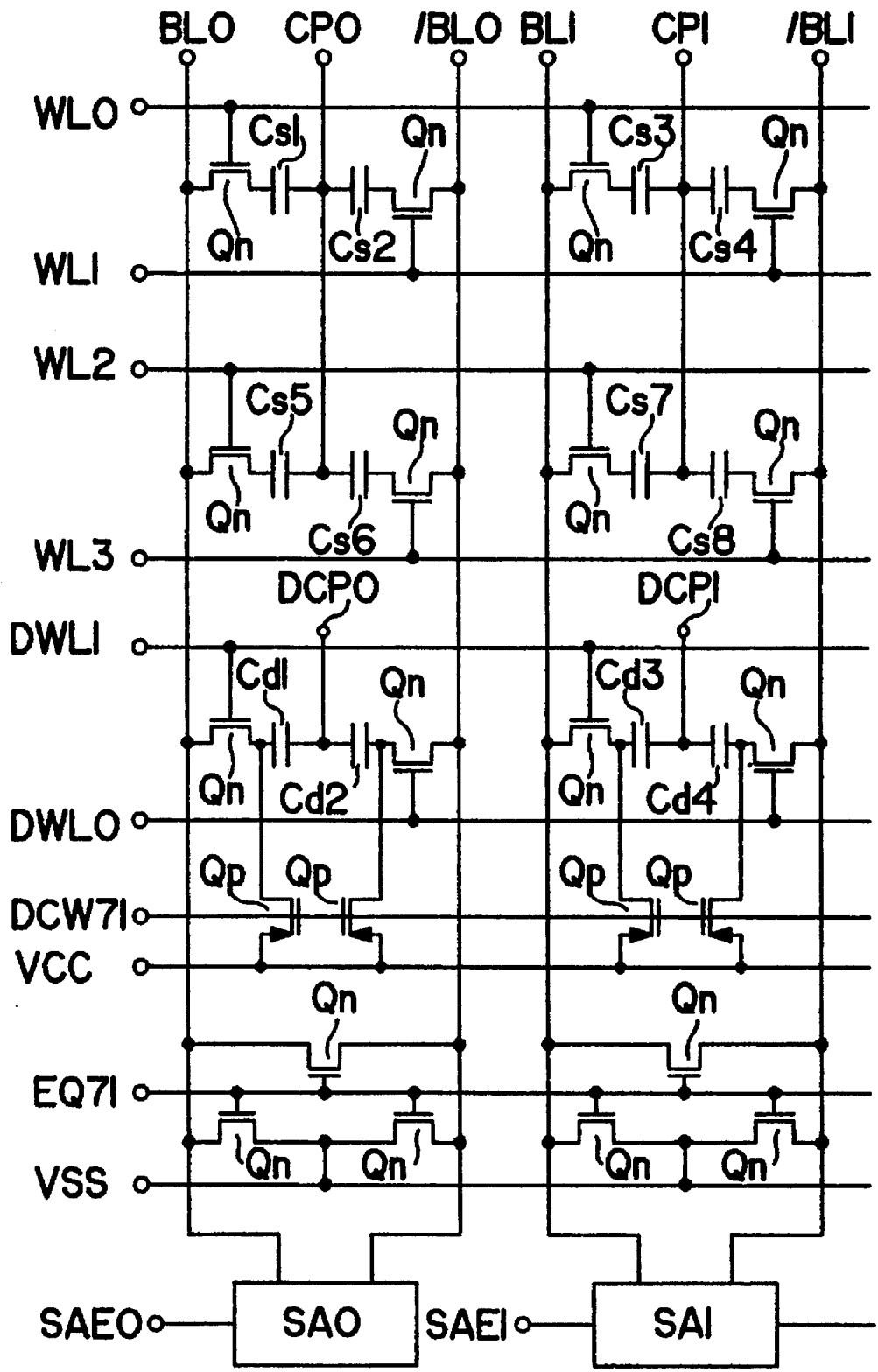
FIG. 14 is a diagram showing a circuit configuration of a seventh embodiment of a semiconductor memory device of the invention.

FIG. 14 shows the seventh embodiment of the invention.

The seventh embodiment is similar to the sixth embodiment, except that the transistor having the dummy memory cell data initializing control signal DCW71 connected to its gate is a P-channel type MOS transistor Qp.

A main body memory cell is composed of main body memory cell ferrodielectric capacitors Cs1 to Cs8, and N-channel type MOS transistors Qn having word lines WL0 to WL8 connected to the gates thereof. The first electrodes of the main body memory cell ferrodielectric capacitors Cs1 to Cs8 are connected to the sources of the N-channel type MOS transistors Qn, and the second electrodes of the main body memory cell ferrodielectric capacitors Cs1 to Cs8 are connected to either cell plate electrode CP0 or CP1. The drains of the N-channel type MOS transistors Qn composing the main body memory cell are connected to any one of bit lines BL0, /BL0, BL1, /BL1. A dummy memory cell is similarly composed of dummy memory cell ferrodielectric capacitors Cd1 to Cd4, and N-channel type MOS transistors Qn having dummy word lines DWL0 to DWL1 connected to the gates thereof. The first electrodes of the dummy memory cell ferrodielectric capacitors Cd1 to Cd4 are connected to the sources of the N-channel type MOS transistors Qn, and the second electrodes of the dummy memory cell ferrodielectric capacitors Cd1 to Cd4 are connected to either one of dummy cell plate electrodes DCP0 and DCP1. The first electrodes of the dummy memory cell ferrodielectric capacitors Cd1 to Cd4 are connected to a supply voltage VCC through the P-channel type MOS transistor Qp, which is the dummy memory cell data initializing control signal DCW71, at the gate. The drains of the N-channel type MOS transistors Qn for composing the dummy memory cell are connected to any one of bit lines BL0, /BL0, BL1, /BL1. The sets of bit lines BL0 and /BL0, and BL1 and /BL1 are respectively connected to the sense amplifiers SA0, SA1. The sense amplifiers SA0, SA1 are controlled by sense amplifier control signals SAE0, SAE1, respectively, and they operate when SAE0, SAE1 are logic voltage H. The sets of bit lines BL0 and /BL0, and BL1 and /BL1 are connected through the N-channel type MOS transistors Qn of which gates are bit line equalizing and precharging control signals EQ71. The bit lines BL0, /BL0, BL1, and /BL1 are connected to a grounding voltage VSS through the N-channel type MOS transistors Qn of which gates are bit line equalizing and precharging control signals EQ71.

Figure 15:
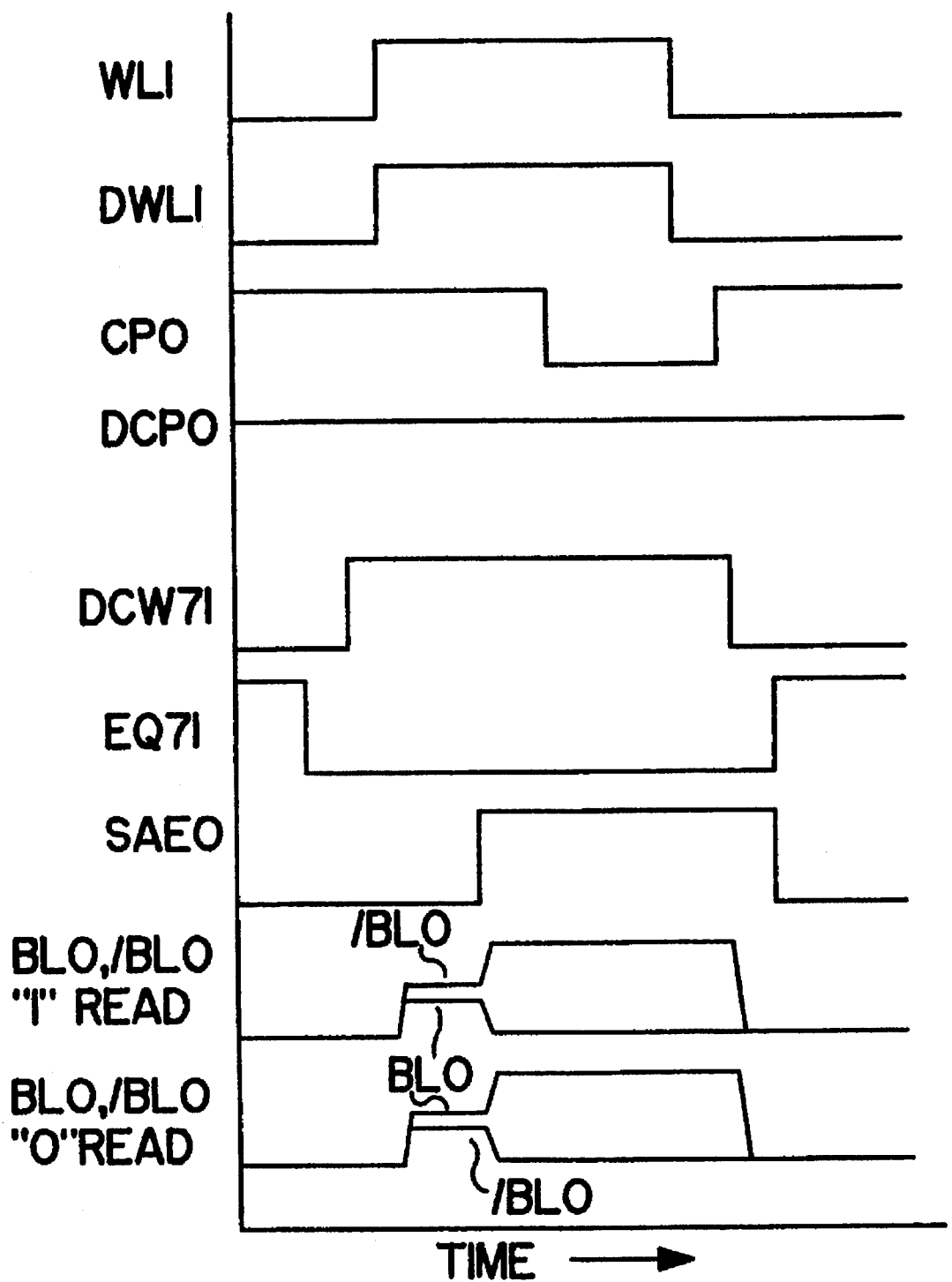
FIG. 15 is a diagram showing the operation timing in the seventh embodiment of the semiconductor memory device of the invention.

The operation of the semiconductor memory device is described while referring to the operation timing in FIG. 15. The ferrodielectric element of the main body memory cell capacitor shows the hysteresis characteristic shown in FIG. 26, and the ferrodielectric element of the dummy memory cell capacitor shows the hysteresis characteristic shown in FIG. 27.

Herein, to read out the data of the main body memory cell, as the initial state, the word lines, dummy word lines and sense amplifier control signals are set at logic voltage L, cell plate electrodes and dummy cell plate electrodes at logic voltage H, and the dummy memory cell data initializing control signal DCW71 at logic voltage L. At this time, the data of the dummy memory cell is the state at point K in FIG. 27, which is an initial state. The bit line equalizing and precharging control signal EQ71 is set at the logic voltage H, and the bit wire is set at logic voltage L. Afterwards, the bit line equalizing and precharging control signals EQ71 are set at logic voltage L, and the bit lines are set in floating state. Furthermore, the dummy memory cell data initializing control signal DCW71 is set at logic voltage H, and the first electrode of the dummy memory cell ferrodielectric capacitor is set in floating state.

Consequently, to read out the data of the main body memory cell capacitor Cs2, the word line WL1 and dummy word line DWL1 are set at logic voltage H, and hence the data in the dummy memory cell is read out into the bit line BL0, and the data of the main body memory cell is read out in the bit line /BL0. At this time, when the data of the main body memory cell is 1, changing from the state of point B to the state of point D in FIG. 26, the electric charge Q1 is read out in the bit line. When the data of the main body memory cell is 0, changing from the state of point E to the state of point D in FIG. 26, the electric charge Q0 is read out in the bit line. Consequently, the dummy memory cell changes from the state at point K to the state at point J in FIG. 27, and the electric charge Qd is read out in the bit line. Then, setting the sense amplifying control signal SAE0 at logic voltage H, the sense amplifier SA0 is operated, and the data being read out in the bit lines BL0, /BL0 are amplified.

Next, the cell plate electrode CP0 is set at the logic voltage L. At this time, when the data of the main body memory cell is 1, it comes to be in the state of point A in FIG. 26. When the data of the main body memory cell is 0, the state is point E in FIG. 26. The word line WL1 and dummy word line DWL1 are set at logic voltage L, the cell plate electrode CP0 at logic voltage H, and the dummy memory cell data initializing control signal DCW71 at logic voltage L. At this time, if the data of the main body memory cell is 1, it comes to be in the state of point A or point B in FIG. 26. Or, when the data of the main body memory cell is 0, it becomes the state of point E in FIG. 26, and the dummy memory cell is in the state near point K in FIG. 27. Next, the sense amplifier control signal SAE0 is set at logic voltage L, the bit line equalizing and precharging control signal EQ71 at logic voltage H, and the bit line at logic voltage L.

It is a feature of the seventh embodiment, same as in the sixth embodiment, that the data can be read out from the main body memory cell and dummy memory cell directly into the bit line, when the word lines and dummy word lines are set at logic voltage H, by setting, as the initial state for reading out the data of the main body memory cell, the logic voltage of the bit lines and the logic voltage of the cell plate electrodes at opposite logic voltages in the main body memory cell, and the logic voltage of the bit lines and the logic voltage of the first electrode of the dummy memory cell ferrodielectric capacitor at opposite logic voltages in the dummy memory cell. Besides, since the dummy cell plate electrode is fixed at the logic voltage H, it leads to saving of power consumption of the semiconductor memory device.

In the seventh embodiment, data reading of the dummy memory cell is the data reading electric charge Qd of the dummy memory cell as the difference between point K and point J in FIG. 27, but if sufficient electric force is not applied in reading, the electric charge is in saturated state for the electric force near point J, so that error of data reading electric charge Qd of the dummy memory cell is small.

(Eighth embodiment)

Figure 16:
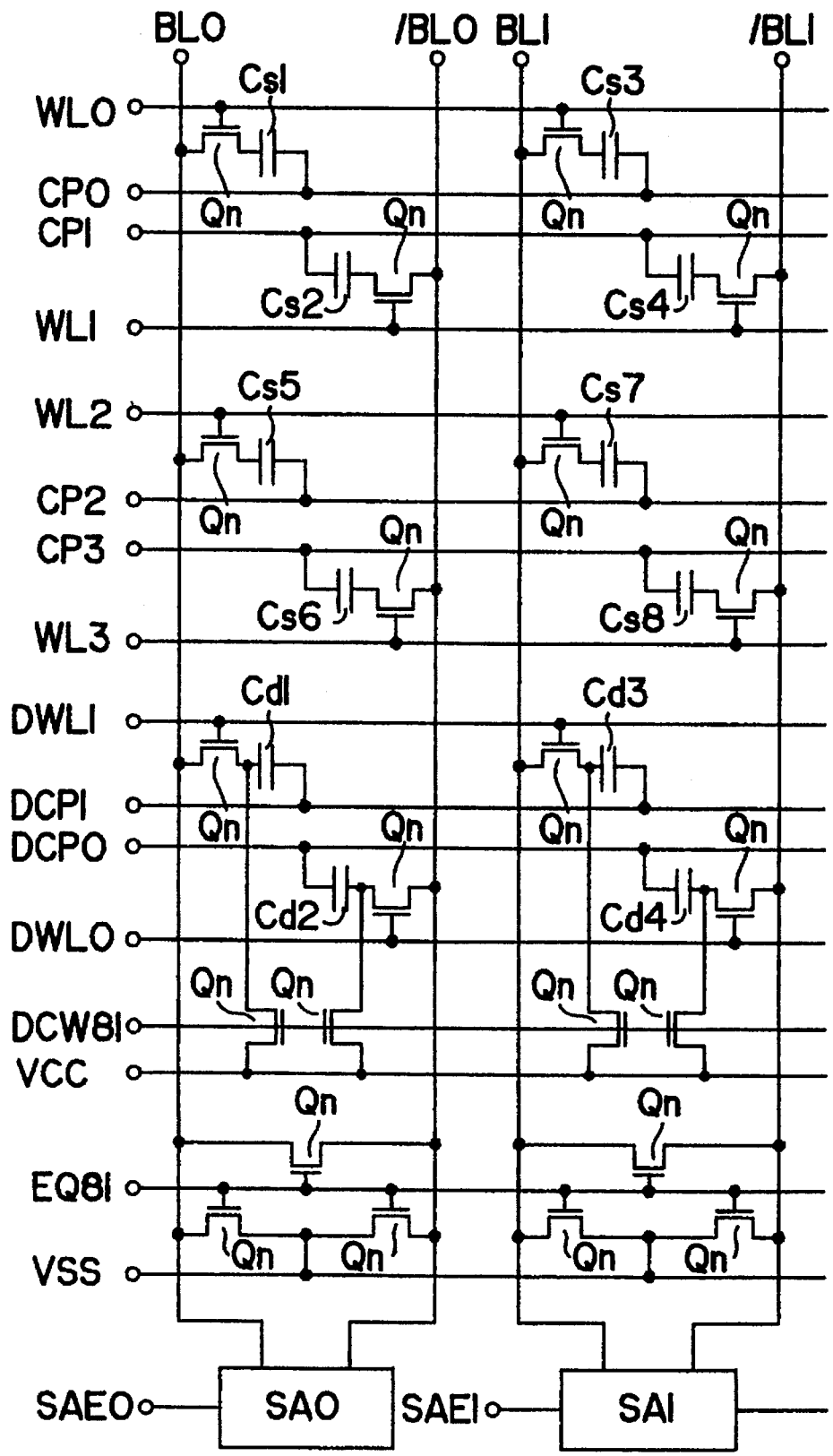
FIG. 16 is a diagram showing a circuit configuration of an eighth embodiment of a semiconductor memory device of the invention.

FIG. 16 shows the eighth embodiment of the invention.

A main body memory cell is composed of main body memory cell ferrodielectric capacitors Cs1 to Cs8, and N-channel type MOS transistors Qn having word lines WL0 to WL3 connected to the gates thereof. The first electrodes of the main body memory cell ferrodielectric capacitors Cs1 to Cs8 are connected to the sources of the N-channel type MOS transistors Qn, and the second electrodes of the main body memory cell ferrodielectric capacitors Cs1 to Cs8 are connected to cell plate electrodes CP0 to CP3. The drains of the N-channel type MOS transistors Qn composing the main body memory cell are connected to any one of bit lines BL0, /BL0, BL1, /BL1. A dummy memory cell is similarly composed of dummy memory cell retrodielectric capacitors Cd1 to Cd4, and N-channel type MOS transistors Qn having dummy word lines DWL0 to DWL1 connected to the gates thereof. The first electrodes of the dummy memory cell ferrodielectric capacitors Cd1 to Cd4 are connected to the sources of the N-channel type MOS transistors Qn, and the second electrodes of the dummy memory cell ferrodielectric capacitors Cd1 to Cd4 are connected to either one of dummy cell plate electrodes DCP0 and DCP1. The first electrodes of the dummy memory cell ferrodielectric capacitors Cd1 to Cd4 are connected to a supply voltage VCC through the N-channel type MOS transistor Qn, which is the dummy memory cell data initializing control signal DCW81, at the gate. The drains of the N-channel type MOS transistors Qn for composing the dummy memory cell are connected to any one of bit lines BL0, /BL0, BL1, /BL1. The sets of bit lines BL0 and /BL0, and BL1 and /BL1 are respectively connected to the sense amplifiers SA0, SA1. The sense amplifiers SA0, SA1 are controlled by sense amplifier control signals SAE0, SAE1, respectively, and they operate when SAE0, SAE1 are logic voltage H. The sets of bit lines BL0 and /BL0, and BL1 and /BL1 are connected through the N-channel type MOS transistors Qn of which gates are bit line equalizing and precharging control signals EQ81. The bit lines BL0, /BL0, BL1, and /BL1 are connected to a grounding voltage VSS through the N-channel type MOS transistors Qn of which gates are bit line equalizing and precharging control signals EQ81.

It is a characteristic constitution of the eighth embodiment that the cell plate electrodes of the memory cell capacitors of the main body memory cell that are selected by one word line are always the same. That is, it is designed to read all of the data in the main body memory cell selected by one word line.

Figure 17:
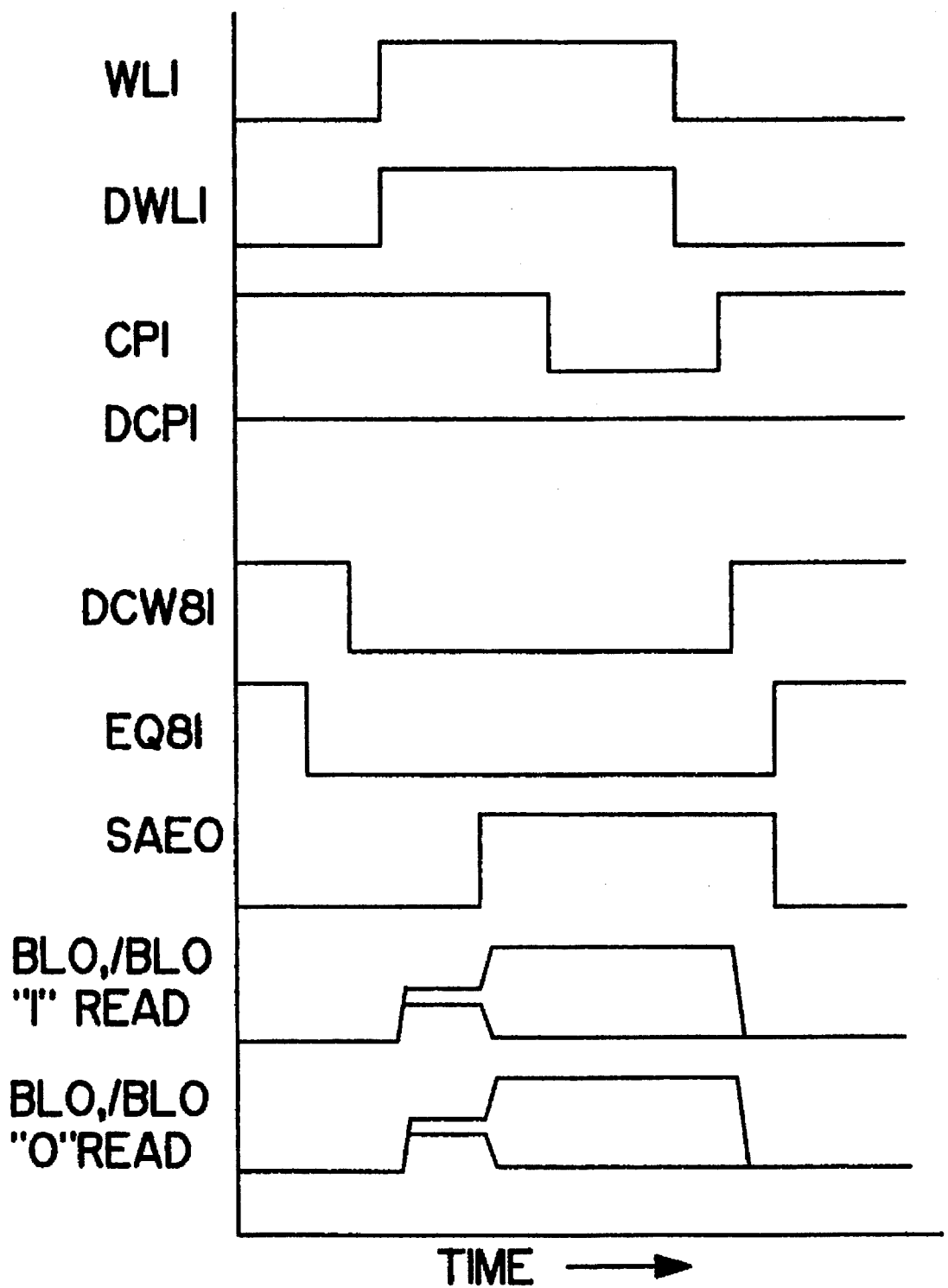
FIG. 17 is a diagram showing the operation timing in the eighth embodiment of the semiconductor memory device of the invention.

The operation of the semiconductor memory device is described while referring to the operation timing in FIG. 17. The ferrodielectric element of the main body memory cell capacitor shows the hysteresis characteristic shown in FIG. 26, and the ferrodielectric element of the dummy memory cell capacitor shows the hysteresis characteristic shown in FIG. 27.

Herein, to read out the data of the main body memory cell, as the initial state, the word line WL1, dummy word line DWL1 and sense amplifier control signals are set at logic voltage L, cell plate electrode CP1 and dummy cell plate electrode DCP1 at logic voltage H, and the dummy memory cell data initializing control signal DCW81 at logic voltage H. At this time, the data of the dummy memory cell is the state at point K in FIG. 27, which is an initial state, and the bit line equalizing and precharging control signal EQ81 is set at the logic voltage H, and the bit wire is set at logic voltage L. Afterwards, the bit line equalizing and precharging control signals EQ81 are set at logic voltage L, and the bit lines are set in floating state. Furthermore, the dummy memory cell data initializing control signal DCW81 is set at logic voltage L, and the first electrode of the dummy memory cell ferrodielectric capacitor is set in floating state.

Consequently, to read out the data of the main body memory cell capacitor Cs2, the word line WL1 and dummy word line DWL1 are set at logic voltage H. As a result, the data in the dummy memory cell is read out into the bit line BL0, and the data of the main body memory cell is read out in the bit line /BL0. At this time, when the data of the main body memory cell is 1, changing from the state of point B to the state of point D in FIG. 26, the electric charge Q1 is read out in the bit line. When the data of the main body memory cell is 0, changing from the state of point E to the state of point D in FIG. 26, the electric charge Q0 is read out in the bit line. Consequently, the dummy memory cell changes from the state at point K to the state at point J in FIG. 27, and the electric charge Qd is read out in the bit line. Then, setting the sense amplifying control signal SAE0, SAE1 at logic voltage H, the sense amplifiers SA0, SA1 are operated, and the data being read out in the bit lines BL0, /BL0 are amplified.

Next, the cell plate electrode CP1 is set at the logic voltage L. At this time, when the data of the main body memory cell is 1, it comes to be in the state of point A in FIG. 26, and when the data of the main body memory cell is 0, the state is point E in FIG. 26.

The word line WL1 and dummy word line DWL1 are set at logic voltage L, the cell plate electrode CP1 at logic voltage H, and the dummy memory cell data initializing control signal DCW81 at logic voltage H. At this time, if the data of the main body memory cell is 1, it comes to be in the state of point A or point B in FIG. 26. Or, when the data of the main body memory cell is 0, it becomes the state of point E in FIG. 26. At this time, the dummy memory cell is in the state near point K in FIG. 27. Next, the sense amplifier control signals SAE0, SAE1 are set at logic voltage L, the bit line equalizing and precharging control signal EQ81 at logic voltage H, and the bit line at logic voltage L.

It is a feature of the eighth embodiment, same as in the sixth embodiment, that the data can be read out from the main body memory cell and dummy memory cell directly into the bit line, when the word lines and dummy word lines are set at logic voltage H, by setting, as the initial state for reading out the data of the main body memory cell, the logic voltage of the bit lines and the logic voltage of the cell plate electrodes at opposite logic voltages in the main body memory cell, and the logic voltage of the bit lines and the logic voltage of the first electrode of the dummy memory cell ferrodielectric capacitor at opposite logic voltages in the dummy memory cell. Moreover, since the dummy cell plate electrode can be fixed at logic voltage H, the power consumption of the semiconductor memory device can be saved. In the eighth embodiment, the data of the main body memory cell selected by one word line can be read out either partly or completely.

(Ninth embodiment)

Figure 18:
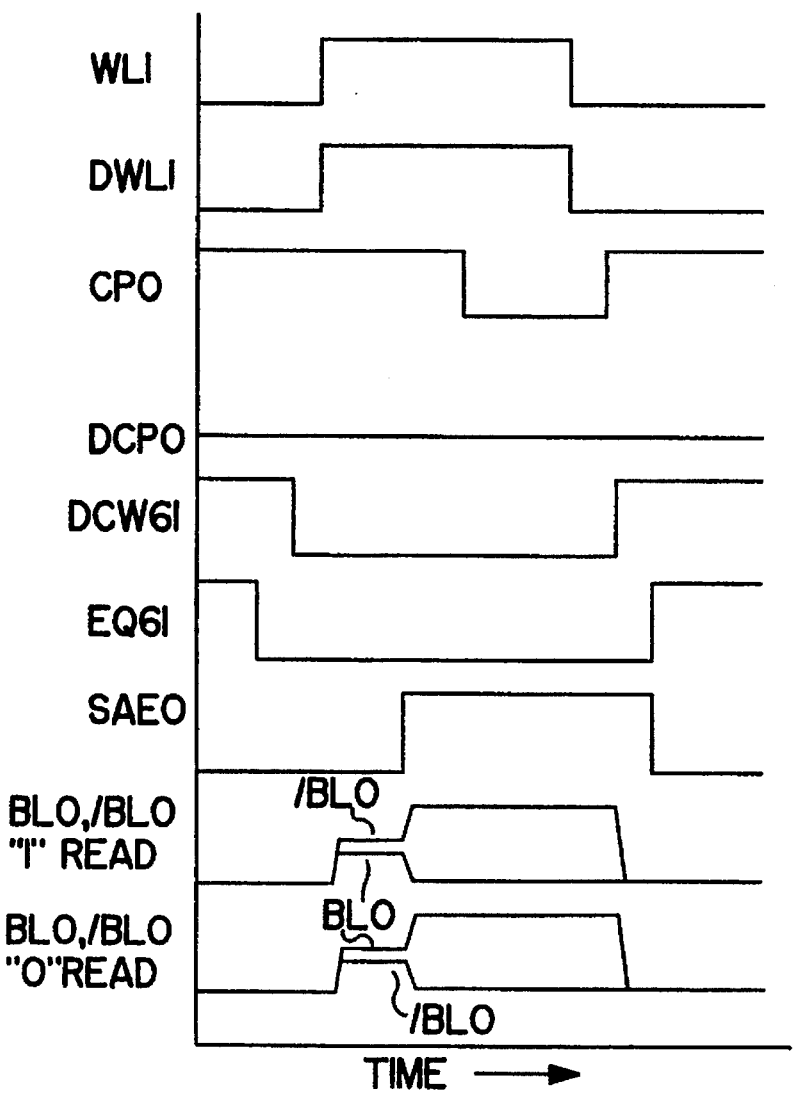
FIG. 18 is a diagram showing the operation timing in a ninth embodiment of a semiconductor memory device of the invention.

The ninth embodiment of the invention is described below while referring to the circuit diagram in FIG. 12 and the operation timing in FIG. 18. The circuit diagram in FIG. 12 is same as that of the sixth embodiment.

Figure 19:
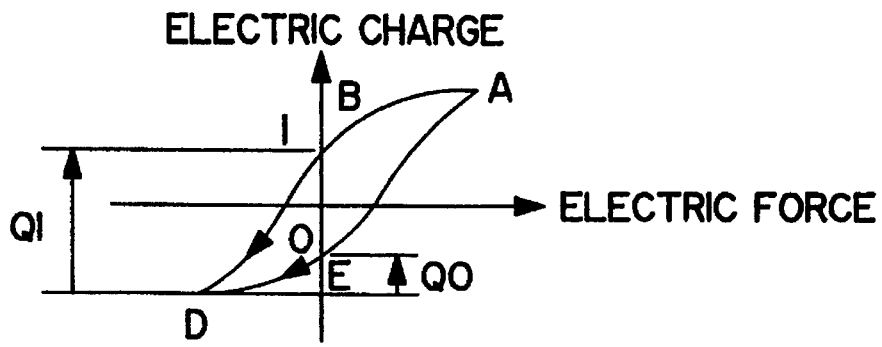
FIG. 19 is a diagram showing the hysteresis characteristic of ferrodielectric element of a main body memory cell capacitor used in the ninth embodiment of the semiconductor memory device of the invention.
Figure 20:
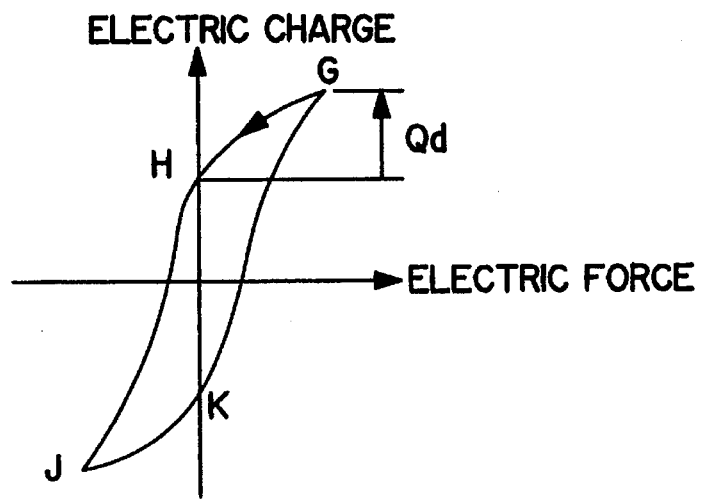
FIG. 20 is a diagram showing the hysteresis characteristic of ferrodielectric element of a dummy memory cell capacitor used in the ninth embodiment of the semiconductor memory device of the invention.

In operation, the ferrodielectric element of the main body memory cell capacitor shows the hysteresis characteristic in FIG. 19, and the ferrodielectric element of the dummy memory cell capacitor shows the hysteresis characteristic in FIG. 20.

Herein, to read out the data of the main body memory cell, as the initial state, the word lines, dummy word lines, sense amplifier control signals, and dummy cell plate electrodes are set at logic voltage L, cell plate electrodes and dummy cell plate electrodes at logic voltage H, and the dummy memory cell data initializing control signal DCW61 at logic voltage H. At this time, the data of the dummy memory cell is the state at point G in FIG. 20, which is an initial state. The bit line equalizing and precharging control signal EQ61 is set at the logic voltage H, and the bit wire is set at logic voltage L. Afterwards, the bit line equalizing and precharging control signals EQ61 are set at logic voltage L, and the bit lines are set in floating state. Furthermore, the dummy memory cell data initializing control signal DCW61 is set at logic voltage L, and the first electrode of the dummy memory cell ferrodielectric capacitor is set in floating state.

Consequently, to read out the data of the main body memory cell capacitor Cs2, the word line WL1 and dummy word line DWL1 are set at logic voltage H, and the data in the dummy memory cell is read out into the bit line BL0, and the data of the main body memory cell is read out in the bit line /BL0. At this time, when the data of the main body memory cell is 1, changing from the state of point B to the state of point D in FIG. 19, the electric charge Q1 is read out in the bit line. When the data of the main body memory cell is 0, changing from the state of point E to the state of point D in FIG. 19, the electric charge Q0 is read out in the bit line. At this time, the dummy memory cell is changed from the state of point G to point H in FIG. 20, and the electric charge Qd is read in the bit line. Then, setting the sense amplifying control signal SAE0 at logic voltage H, the sense amplifier SA0 is operated, and the data being read out in the bit lines BL0, /BL0 are amplified.

Next, the cell plate electrode CP0 is set at the logic voltage L. At this time, when the data of the main body memory cell is 1, it comes to be in the state of point A in FIG. 19, and when the data of the main body memory cell is 0, the state is point E in FIG. 19.

The word line WL1 and dummy word line DWL1 are set at logic voltage L, the cell plate electrode CP0 at logic voltage H, and the dummy memory cell data initializing control signal DCW61 at logic voltage H. At this time, if the data of the main body memory cell is 1, it comes to be in the state of point B in FIG. 19. Or, when the data of the main body memory cell is 0, it becomes the state of point E in FIG. 19. At this time, the dummy memory cell is in the state near point G in FIG. 20. Next, the sense amplifier control signal SAE0 is set at logic voltage L, the bit line equalizing and precharging control signal EQ61 at logic voltage H, and the bit line at logic voltage L.

It is a feature of the ninth embodiment that the data can be read out from the main body memory cell and dummy memory cell directly into the bit line, when the word lines and dummy word lines are set at logic voltage H, by setting, as the initial state for reading out the data of the main body memory cell, the logic voltage of the bit lines and the logic voltage of the cell plate electrodes at opposite logic voltages in the main body memory cell, and the logic voltage of the bit lines and the logic voltage of the first electrode of the dummy memory cell ferrodielectric capacitor at opposite logic voltages in the dummy memory cell. Moreover, since the dummy cell plate electrode can be fixed at logic voltage L, the power consumption of the semiconductor memory device can be saved.

(Tenth embodiment)

Figure 21:
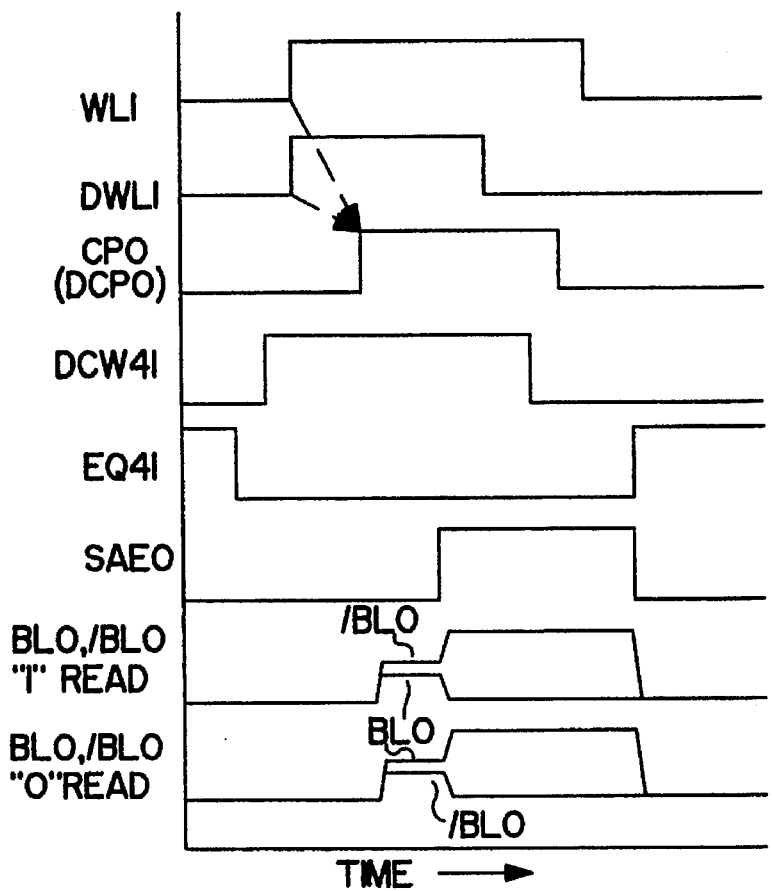
FIG. 21 is a diagram showing the operation timing in a tenth embodiment of a semiconductor memory device of the invention.

The tenth embodiment of the invention is described below by referring to the circuit diagram in FIG. 6 and the operation timing in FIG. 21. The circuit diagram in FIG. 6 is same as in the fourth embodiment.

In operation of the semiconductor memory device, the ferrodielectric element of the main body memory cell capacitor shows the hysteresis characteristic in FIG. 26, and the ferrodielectric element of the dummy memory cell capacitor shows the hysteresis characteristic in FIG. 27.

Herein, to read the data of the main body memory cell, as initial state, the word line, dummy word line, cell plate electrode, dummy cell plate electrode, and sense amplifier control signal are set to logic voltage L, and the dummy memory cell data initializing control signal DCW41 is at logic voltage H. The data of the dummy memory cell at initial state of K in FIG. 27. The bit line equalizing and precharging control signal EQ41 is set at logic voltage H, and the bit line at logic voltage L. Later, the bit line equalizing and precharging control signal EQ41 is set at logic voltage L, and the bit line is set in floating state. The dummy memory cell data initializing control signal DCW41 is set at logic voltage L, and the first electrode of the dummy memory cell ferrodielectric capacitor is set in floating state.

Consequently, to read out the data of the main body memory cell capacitor Cs2, the word line WL1 and dummy word line DWL1 are set at logic voltage H, and the cell plate electrode CP0 (DCP0) is set at logic voltage H, and hence the data in the dummy memory cell is read out into the bit line BL0, and the data of the main body memory cell is read out in the bit line /BL0. At this time, when the data of the main body memory cell is 1, changing from the state of point B to the state of point D in FIG. 26, the electric charge Q1 is read out in the bit line. When the data of the main body memory cell is 0, changing from the state of point E to the state of point D in FIG. 26, the electric charge Q0 is read out in the bit line. Consequently, the dummy memory cell changes from the state at point K to the state at point J in FIG. 27, and the electric charge Qd is read out in the bit line. Then, setting the sense amplifying control signal SAE0 at logic voltage H, the sense amplifier SA0 is operated, and the data being read out in the bit lines BL0, /BL0 are amplified. In consequence, the dummy word line DWL1 is set at logic voltage L. The dummy memory cell data initializing control signal DCW41 is set at logic voltage H, and the dummy memory cell is set in the state of point J in FIG. 27.

Next, the cell plate electrode CP0 (DCP0) is set at the logic voltage L. At this time, when the data of the main body memory cell is 1, it comes to be in the state of point A in FIG. 26. When the data of the main body memory cell is 0, the state is point E in FIG. 26. At this time, the dummy memory cell is in the state of point K in FIG. 27.

The word line WL1 is set at logic voltage L. At this time, if the data of the main body memory cell is 1, it comes to be in the state of point A or point B in FIG. 26. Or, when the data of the main body memory cell is 0, it becomes the state of point E in FIG. 26. Next, the sense amplifier control signal SAE0 is set at logic voltage L, the bit line equalizing and precharging control signal EQ21 at logic voltage H, and the bit line at logic voltage L.

It is a feature of the tenth embodiment that the current consumption is dispersed by deviating the rise time of the word lines and dummy word lines, and the rise time of the cell plate electrode CP0 (DCP0).

(Eleventh embodiment)

Figure 22:
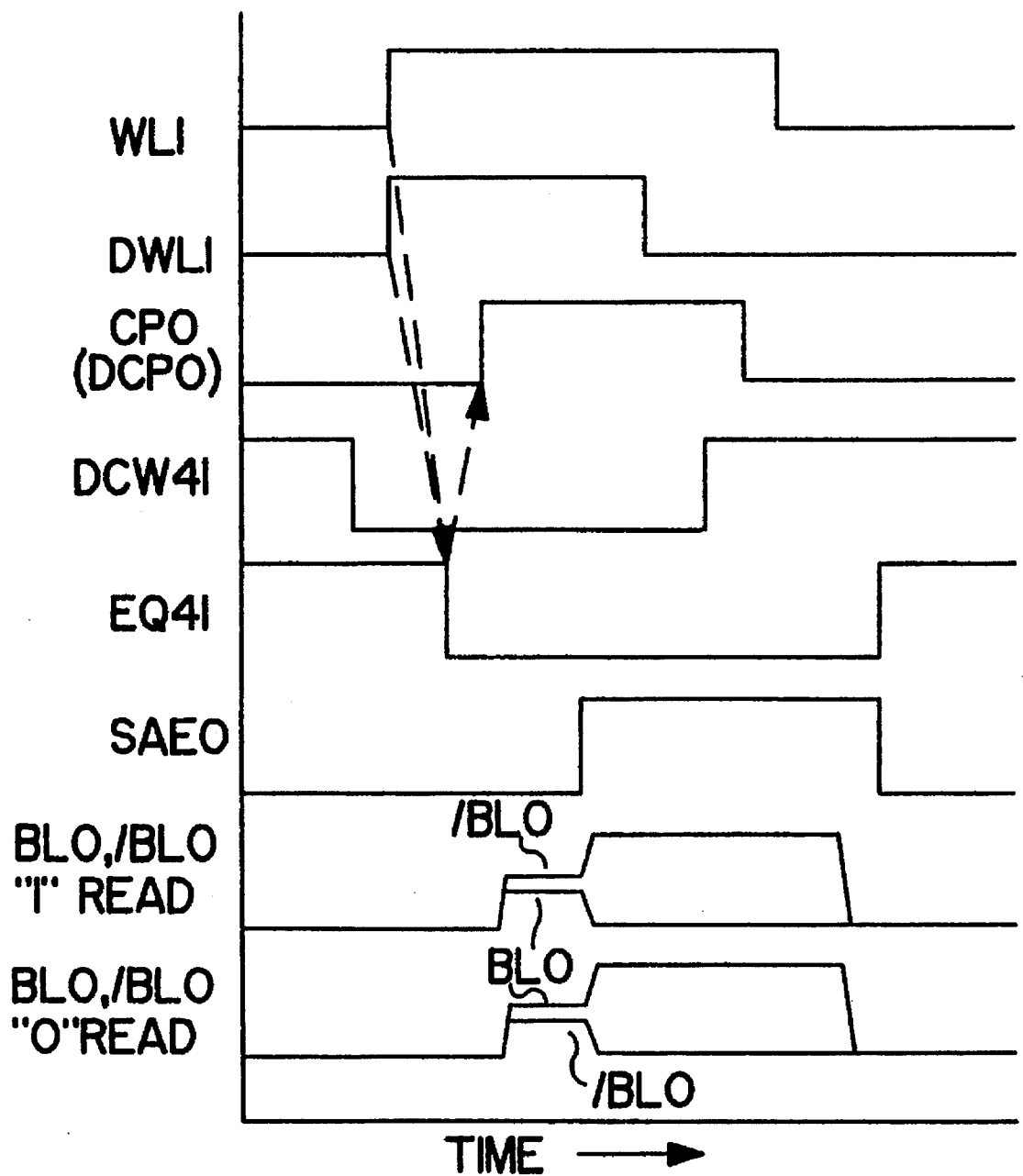
FIG. 22 is a diagram showing the operation timing in an eleventh embodiment of a semiconductor memory device of the invention.

The eleventh embodiment of the invention is described below by referring to the circuit diagram in FIG. 6 and the operation timing in FIG. 22. The circuit diagram in FIG. 6 is same as in the fourth embodiment.

In operation, the ferrodielectric element of the main body memory cell capacitor shows the hysteresis characteristic in FIG. 26, and the ferrodielectric element of the dummy memory cell capacitor shows the hysteresis characteristic in FIG. 27.

Herein, to read the data of the main body memory cell, as initial state, the word line, dummy word line, cell plate electrode, dummy cell plate electrode, and sense amplifier control signal are set to logic voltage L, and the dummy memory cell data initializing control signal DCW41 is at logic voltage H. The data of the dummy memory cell at initial state of K in FIG. 27. The bit line equalizing and precharging control signal EQ41 is set at logic voltage H, and the bit line at logic voltage L. Later, the dummy memory cell data initializing control signal DCW41 is set at logic voltage L, and the first electrode of the dummy memory cell ferrodielectric capacitor is set in floating state. Consequently, to read out the data of the main body memory cell capacitor Cs2, the word line WL1 and dummy word line DWL1 are set at logic voltage H, and the bit line equalizing and precharging control signal EQ41 is set at L, and the bit line is set in floating state.

When the cell plate electrode CP0 (DCP0) is set at logic voltage H, the data in the dummy memory cell is read out into the bit line BL0, and the data of the main body memory cell is read out in the bit line /BL0. At this time, when the data of the main body memory cell is 1, changing from the state of point B to the state of point D in FIG. 26, the electric charge Q1 is read out in the bit line. When the data of the main body memory cell is 0, changing from the state of point E to the state of point D in FIG. 26, the electric charge Q0 is read out in the bit line. Consequently, the dummy memory cell changes from the state at point K to the state at point J in FIG. 27, and the electric charge Qd is read out in the bit line. Then, setting the sense amplifying control signal SAE0 at logic voltage H, the sense amplifier SA0 is operated, and the data being read out in the bit lines BL0, /BL0 are amplified. In consequence, the dummy word line DWL1 is set at logic voltage L. The dummy memory cell data initializing control signal DCW41 is set at logic voltage H, and the dummy memory cell is set in the state of point J in FIG. 27. Next, the cell plate electrode CP0 (DCP0) is set at the logic voltage L. At this time, when the data of the main body memory cell is 1, it comes to be in the state of point A in FIG. 26. When the data of the main body memory cell is 0, the state is point E in FIG. 26. At this time, the dummy memory cell is in the state of point K in FIG. 27. The word line WL1 is set at logic voltage L. At this time, if the data of the main body memory cell is 1, it comes to be in the state of point A or point B in FIG. 26. Or, when the data of the main body memory cell is 0, it becomes the state of point E in FIG. 26. Next, the sense amplifier control signal SAE0 is set at logic voltage L, the bit line equalizing and precharging control signal EQ21 at logic voltage H, and the bit line at logic voltage L.

It is a feature of the eleventh embodiment, same as in the tenth embodiment, that the current consumption can be dispersed by deviating the rise time of the word lines and dummy word lines, and the rise time of the cell plate electrode CP0 (DCP0). Besides, upon rise of the word lines or dummy word lines, since the bit lines are fixed at the logic voltage L, the noise of rise of the word lines and dummy word lines does not overlap on the bit lines. Accordingly, the reading precision of data of the main body memory cell or dummy memory cell is enhanced.

(Twelfth embodiment)

Figure 23:
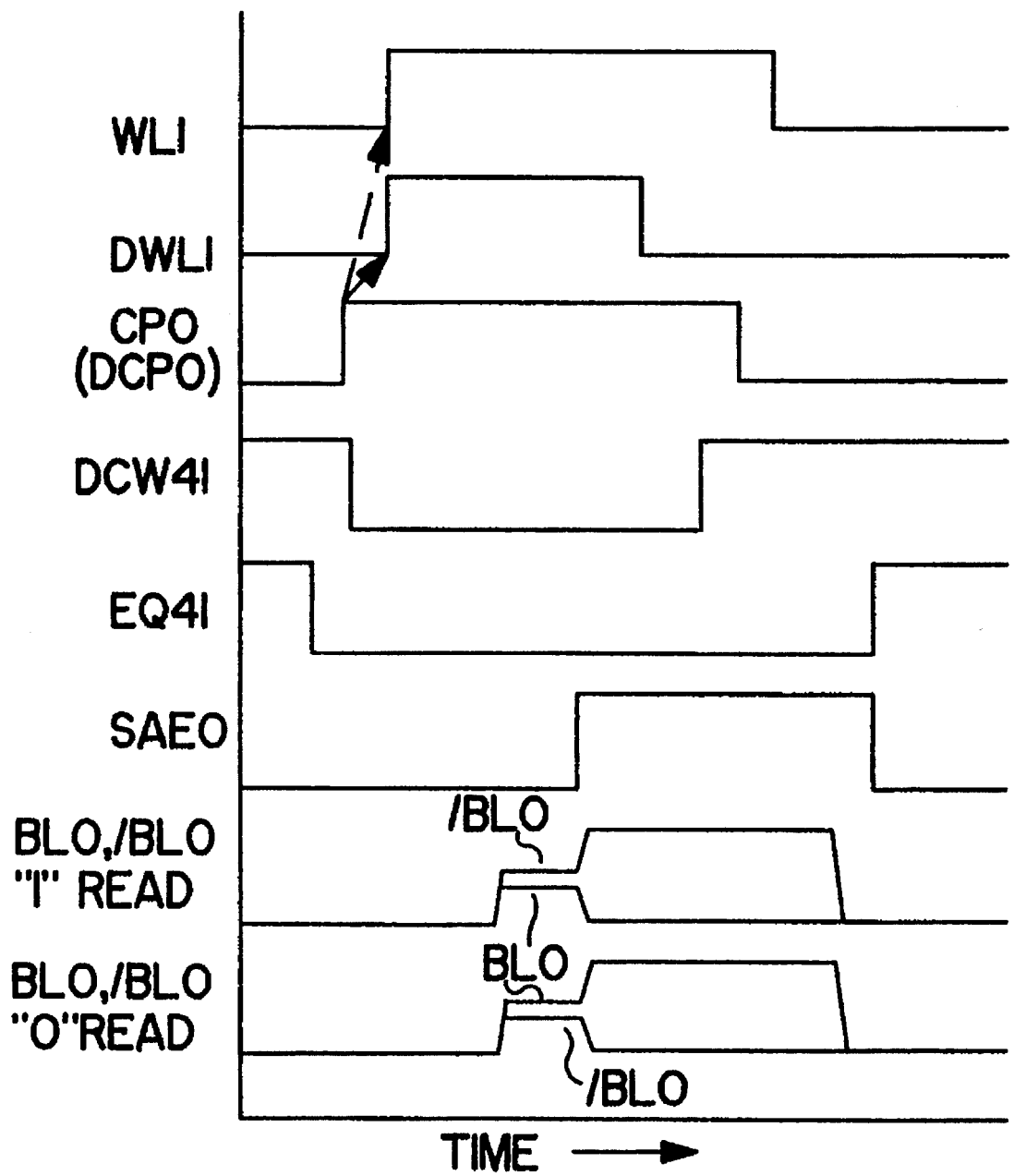
FIG. 23 is a diagram showing the operation timing in a twelfth embodiment of a semiconductor memory device of the invention.
Figure 24:
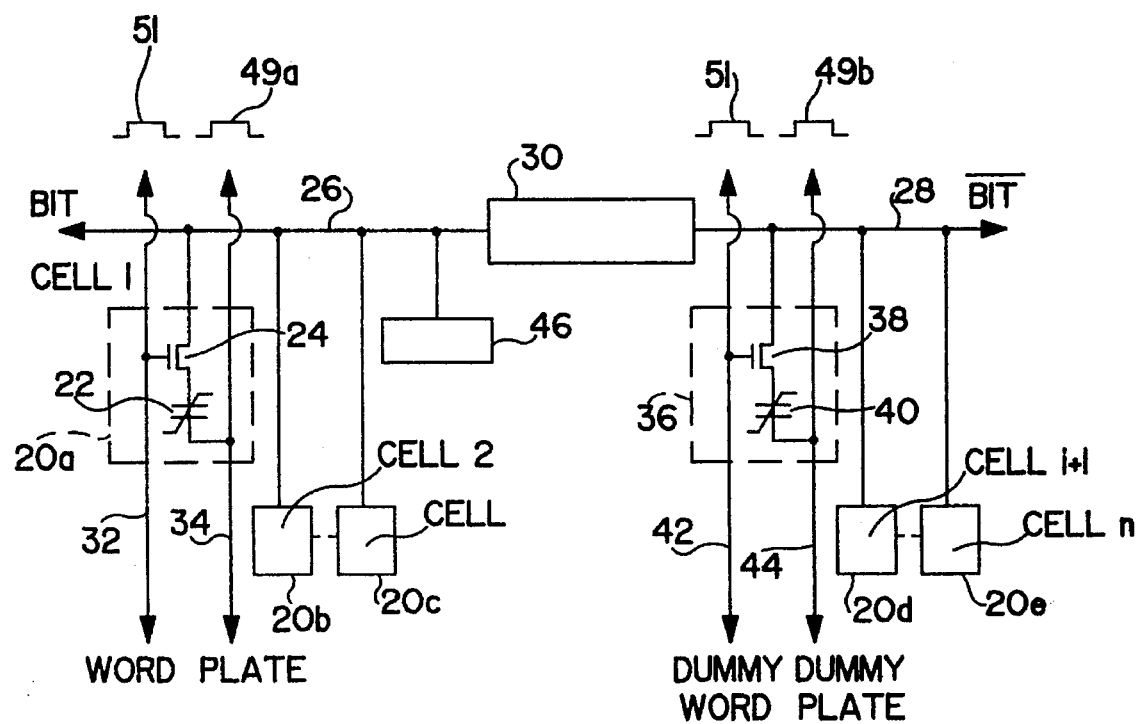
FIG. 24 is a diagram showing a circuit configuration of a conventional semiconductor memory device.
Figure 25:
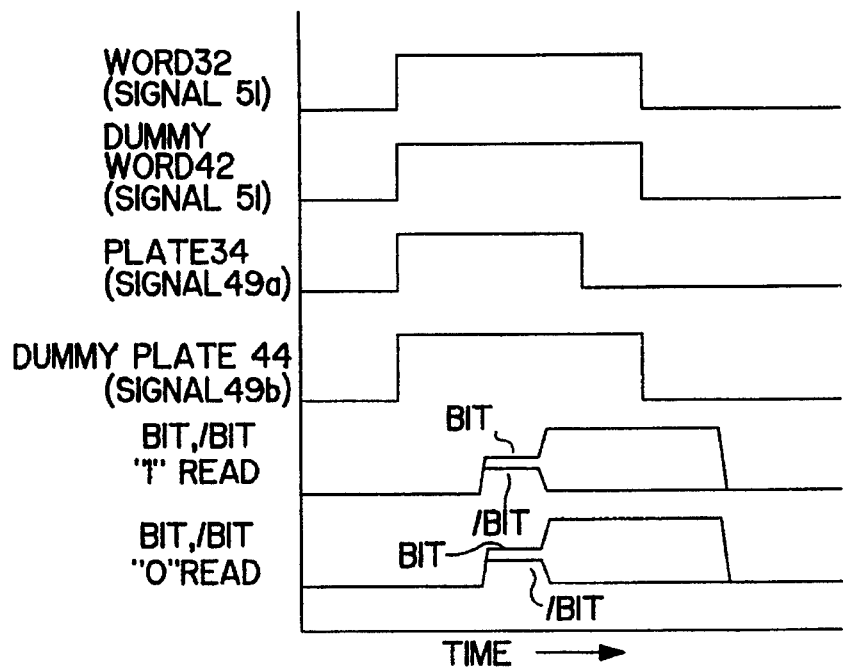
FIG. 25 is a diagram showing the operation timing of a conventional semiconductor memory device.

The twelfth embodiment of the invention is described below by referring to the circuit diagram in FIG. 6 and the operation timing in FIG. 23. The circuit diagram in FIG. 6 is same as in the fourth embodiment.

In operation, the ferrodielectric element of the main body memory cell capacitor shows the hysteresis characteristic in FIG. 26, and the ferrodielectric element of the dummy memory cell capacitor shows the hysteresis characteristic in FIG. 27.

Herein, to read the data of the main body memory cell, as initial state, the word line, dummy word line, cell plate electrode, dummy cell plate electrode, and sense amplifier control signal are set to logic voltage L, and the dummy memory cell data initializing control signal DCW41 is at logic voltage H. At this time, the data of the dummy memory cell is the state at point K in FIG. 27, which is an initial state. The bit line equalizing and precharging control signal EQ41 is set at logic voltage H, and the bit line is set at logic voltage L. Later, the bit line equalizing and precharging control signal EQ41 is set at logic voltage L, and the bit line is set in floating state. The dummy memory cell data initializing control signal DCW41 is set at logic voltage L, and the first electrode of the dummy memory cell ferrodielectric capacitor is set in floating state. At this time, the cell plate electrode CP0 (DCP0) is set at logic voltage H. Consequently, to read out the data of the main body memory cell capacitor Cs2, the word line WL1 and dummy word line DWL1 are set at logic voltage H. As a result, the data of the dummy memory cell is read out in bit line BL0, and the data of the main body memory cell is read out in bit line /BL0. At this time, when the data of the main body memory cell is 1, changing from the state of point B to the state of point D in FIG. 26, the electric charge Q1 is read out in the bit line. When the data of the main body memory cell is 0, changing from the state of point E to the state of point D in FIG. 26, the electric charge Q0 is read out in the bit line. At this time, the dummy memory cell changes from the state at point K to the state at point J in FIG. 27, and the electric charge Qd is read out in the bit line. Then, setting the sense amplifying control signal SAE0 at logic voltage H, the sense amplifier SA0 is operated, and the data being read out in the bit lines BL0, /BL0 are amplified. In consequence, the dummy word line DWL1 is set at logic voltage L. The dummy memory cell data initializing control signal DCW41 is set at logic voltage H, and the dummy memory cell is set in the state of point J in FIG. 27. Next, the cell plate electrode CP0 (DCP0) is set at the logic voltage L. At this time, when the data of the main body memory cell is 1, it comes to be in the state of point A in FIG. 26. When the data of the main body memory cell is 0, the state is point E in FIG. 26. At this time, the dummy memory cell is in the state of point K in FIG. 27. The word line WL1 is set at logic voltage L. At this time, if the data of the main body memory cell is 1, it comes to be in the state of point A or point B in FIG. 26. Or, when the data of the main body memory cell is 0, it becomes the state of point E in FIG. 26. Next, the sense amplifier control signal SAE0 is set at logic voltage L, the bit line equalizing and precharging control signal EQ21 at logic voltage H, and the bit line at logic voltage L.

It is a feature of the twelfth embodiment, same as in the tenth embodiment, that the current consumption can be dispersed by deviating the rise time of the word lines and dummy word lines, and the rise time of the cell plate electrode CP0 (DCP0). Besides, if the parasitic capacity of the cell plate electrode is large and it takes along time in rise, by starting up the cell plate electrode earlier, data of the main body memory cell or dummy memory cell can be read out at high speed.

According to the semiconductor memory device of the invention, the dummy memory cell capacitor can be initialized, and malfunction in reading can be avoided. The state of the dummy memory cell capacitor after reading out the data can be securely set to the initial state, so that malfunction in reading may be eliminated. Moreover, the semiconductor memory device with less concentration of power consumption may be realized.

Therefore, the spirit and scope of the appended claims should not be limited to the description of the preferred versions contained herein.

What is claimed is:

1. A semiconductor memory device comprising:

a first electrode receiving a first logic voltage;

a second electrode receiving a second logic voltage;

main memory means for storing data, said main memory means having a first ferroelectric capacitor coupled to a first MOS transistor and said first electrode;

dummy memory means for transferring data to and from said main memory means, said dummy memory means having a second capacitor coupled to a second MOS transistor and said second electrode; and means for inverting the logic voltage of the first electrode after turning off the second MOS transistor.

2. The semiconductor memory device of claim 1, further including means for (1) inverting the first logic voltage and the second logic voltage after turning off the second MOS transistor, and (2) turning off the first MOS transistor after the first electrode and the second electrode are inverted.

3. The semiconductor memory device of claim 1, further including:

a first bit line coupled to the first NOS transistor;

a second bit line coupled to the second MOS transistor; and means, (1) before one of (a) a start of writing and (b) a start of reading and (2) after one of (a) an end of writing, and (b) an end of reading of the main memory means, for (1) setting the second bit line at a certain logic voltage and activating the second MOS transistor, and (2) then setting the logic voltage of the second electrode at a reverse logic voltage of the certain logic voltage.

4. A semiconductor memory device comprising:

an initializing control signal line;

an initializing potential signal line;

a first electrode having a first logic voltage;

a second electrode having a second logic voltage;

main memory means for storing data, said main memory means having a first ferroelectric capacitor coupled to a first MOS transistor and said first electrode;

dummy memory means for transferring data to and from said main memory means, said dummy memory means having a second capacitor coupled to a second MOS transistor and said second electrode; and a third MOS transistor coupled to the initializing control signal line, the initializing potential signal line, and the second ferroelectric capacitor.

5. The semiconductor memory device of claim 4, wherein the initializing potential signal line is connected to a grounding potential.

6. The semiconductor memory device of claim 4, further including
   a first bit line coupled to the first MOS transistor;
   a second bit line coupled to the second MOS transistor; and
   means for setting said second bit line and said first bit line at a grounding potential before a start of one of (a) writing and (b) reading of the main memory means.

7. The semiconductor memory device of claim 4, further including means for (1) turning on the third MOS transistor after the second MOS transistor is turned off, and (2) turning off the first MOS transistor after the first logic voltage and the second logic voltage are inverted.

8. A semiconductor memory device of claim 1, further including
   a first bit line coupled to the first MOS transistor, said first bit line having a bit line logic voltage; and
   means for setting the first logic voltage of the first electrode at an inverse logic voltage of the bit line logic voltage before reading of the main memory means.

9. The semiconductor memory device of claim 4, further including
   a first bit line coupled to the first MOS transistor, said first bit line having a bit line logic voltage; and
   means for setting the first logic voltage of the first electrode at an inverse logic voltage of the bit line logic voltage before reading of the main memory means.

10. The semiconductor memory device of claim 1, wherein the second MOS transistor has a source coupled to the second ferroelectric capacitor and wherein said semiconductor memory device further includes
    a first bit line coupled to the first MOS transistor;
    a second bit line coupled to the second MOS transistor, said second bit line having a bit line logic voltage; and
    means for setting a source logic voltage at the source of the second MOS transistor and the second logic voltage at a inverse logic voltage of the bit line logic voltage before reading of the main memory means.

11. The semiconductor memory device of claim 8, wherein one of (a) the first logic voltage and (b) the second logic voltage is always the same.

12. The semiconductor memory device of claim 9, wherein one of (a) the first logic voltage and (b) the second logic voltage is always the same.

13. The semiconductor memory device of claim 10, wherein one of (a) the first logic voltage and (b) the second logic voltage is always the same.

14. The semiconductor memory device of claim 4, wherein the second MOS transistor has a source coupled to the second ferroelectric capacitor and wherein said semiconductor memory device further includes
    a first bit line coupled to the first MOS transistor;
    a second bit line coupled to the second MOS transistor, said second bit line having a bit line logic voltage; and
    means for setting a source logic voltage at the source of the second MOS transistor and the second logic voltage at a inverse logic voltage of the bit line logic voltage before reading of the main memory means.

15. The semiconductor memory device of claim 1, wherein the second MOS transistor has a source coupled to the second ferroelectric capacitor and a source logic voltage at the source of the second MOS transistor; and wherein the semiconductor memory device further includes
    a first bit line coupled to the first MOS transistor;
    a second bit line coupled to the second MOS transistor, said second bit line having a bit line logic voltage; and
    means for setting the bit line logic voltage and the second logic voltage at an inverse logic voltage of the source logic voltage before reading of the main memory means.

16. The semiconductor memory device of claim 4, wherein the second MOS transistor has a source coupled to the second ferroelectric capacitor and a source logic voltage at the source of the second MOS transistor; and wherein the semiconductor memory device further includes
    a first bit line coupled to the first MOS transistor;
    a second bit line coupled to the second MOS transistor, said second bit line having a bit line logic voltage; and
    means for setting the bit line logic voltage and the second logic voltage at an inverse logic voltage of the source logic voltage before reading of the main memory means.

17. The semiconductor memory device of claim 1, further including means for inverting the first logic voltage of the first electrode and the second logic voltage of the second electrode after turning on the first MOS transistor and the second MOS transistor.

18. The semiconductor memory device of claim 4, further including means for inverting the first logic voltage of the first electrode and the second logic voltage of the second electrode after turning on the first MOS transistor and the second MOS transistor.

19. The semiconductor memory device of claim 1, further including
    a first bit line coupled to the first NOS transistor;
    a second bit line coupled to the second MOS transistor; and
    means for (a) pre-charging the first line and the second bit line after turning on the first MOS transistor and the second MOS transistor, (b) terminating the pre-charging before a start of one of (a) reading and (b) writing of the main memory means, and (c) then inverting the first logic voltage of the first electrode and the second logic voltage of the second electrode.

20. The semiconductor memory device of claim 4, further including
    a first bit line coupled to the first NOS transistor;
    a second bit line coupled to the second MOS transistor; and
    means for (a) pre-charging the first line and the second bit line after turning on the first MOS transistor and the second MOS transistor, (b) terminating the pre-charging before a start of one of (a) reading and (b) writing of the main memory means, and (c) then inverting the first logic voltage of the first electrode and the second logic voltage of the second electrode.

21. The semiconductor memory device of claim 4, further including means for turning on the first MOS transistor and the second MOS transistor after inverting the logic voltages of the first electrode and the second electrode.

22. The semiconductor memory device of claim 1, further including means for turning on the first MOS transistor and the second MOS transistor after inverting the logic voltages of the first electrode and the second electrode.

23. The semiconductor memory device of claim 1, wherein the first electrode is coupled to the second electrode.

24. A semiconductor memory device comprising:
    an electrode;
    main memory means for storing data, said main memory means having a first ferroelectric capacitor coupled to a first MOS transistor and said electrode; and dummy memory means for transferring data to and from said main memory means, said dummy memory means having a second capacitor coupled to a second MOS transistor and said electrode.

25. A semiconductor memory device comprising:

an amplifier, a first word line and a second word line, a first bit line and a second bit line connected to the amplifier, a first plate electrode and a second plate electrode, a first ferroelectric capacitor having a first electrode and a second electrode, the second electrode coupled to the first plate electrode, a first MOS transistor having a gate coupled to the first word line, a source coupled to the first electrode of the first ferroelectric capacitor, and a drain coupled to the first bit line, a second ferroelectric capacitor having a first electrode and a second electrode, the second electrode couple to the second plate electrode, and a second MOS transistor having a gate coupled to the second word line, a source coupled to the first electrode of the second ferroelectric capacitor, and a drain coupled to the second bit line wherein the electric field between the first electrode and the second electrode of the second ferroelectric capacitor is always in a first direction including zero.

26. The semiconductor memory device as recited in claim 1, wherein an electric field is formed between the first electrode and the second electrode of the second ferroelectric capacitor, said electric field is oriented in a first direction when the second MOS transistor is activated.

27. The semiconductor memory device as recited in claim 1, wherein an electric potential is formed between the first electrode and the second electrode of the second ferroelectric capacitor and wherein the second MOS transistor is activated after the electric potential between the first electrode and the second electrode of the second ferroelectric capacitor is changed to a different electric potential.

28. The semiconductor memory device as recited in claim 1, wherein the second plate electrode has an electric potential which is changed after the second MOS transistor is activated.

29. The semiconductor memory device recited in claim 1, wherein the second plate electrode has an electric potential and wherein the second MOS transistor is turned on after the electric potential of the second plate electrode is changed.

30. A semiconductor memory device comprising:

an amplifier, a first word line and a second word line, a first plate electrode and a second plate electrode, a first bit line and a second bit line connected to the amplifier, a first ferroelectric capacitor having a first electrode and a second electrode, the second electrode coupled to the first plate electrode, a first MOS transistor having a gate coupled to the first word line, a source coupled to the first electrode of the first ferroelectric capacitor, and a drain coupled to the first bit line, a second ferroelectric capacitor having a first electrode and a second electrode, the second electrode coupled to the first plate electrode, and a second MOS transistor having a gate coupled to a second word line, a source coupled to the first electrode of the second ferroelectric capacitor, and a drain coupled to the second bit line, an electric field formed between the first bit line and the second electrode of the first ferroelectric capacitor so that the electric field is (a) oriented in a first direction when the first MOS transistor is activated and (b) oriented in a second direction before the first MOS transistor is deactivated, said first direction is the opposite of said second direction.

31. A semiconductor memory device comprising:

an amplifier, a first word line and a second word line, a first plate electrode and a second plate electrode, a first bit line and a second bit line connected to the amplifier, a first ferroelectric capacitor having a first electrode and a second electrode, the second electrode of the first ferroelectric capacitor coupled to the first plate electrode, a first MOS transistor having a gate coupled to the first word line, a source coupled to the first electrode of the first ferroelectric capacitor, and a drain coupled to the first bit line, a second ferroelectric capacitor having a first electrode and a second electrode, and the second electrode of the second ferroelectric capacitor coupled to the second plate electrode, a second MOS transistor having a gate coupled to the second word line, a source coupled to the first electrode of the second ferroelectric capacitor, and a drain coupled to the second bit line, a first electric field formed between the first bit line and the second electrode of the first ferroelectric capacitor so that the electric field is oriented in a first direction when the first MOS transistor is activated and orientated in a second direction before the first MOS transistor and the second MOS transistors are deactivated, said first electric field and said second electric field are oriented in opposite directions, and a second electric field formed between the second bit line and the second electrode of the second ferroelectric capacitor so that the second electric field is orientated in a third direction when the second MOS transistor is activated and the second electric field is oriented in the third direction after the first MOS transistor and the second MOS transistors are deactivated.

* * * * *